(12) United States Patent
Yang et al.

(10) Patent No.: US 10,985,696 B2
(45) Date of Patent: Apr. 20, 2021

(54) METHOD, APPARATUS, AND DEVICE FOR IDENTIFYING CELL STRING FAULT IN OPTOELECTRONIC SYSTEM

(71) Applicant: Huawei Technologies Co., Ltd., Shenzhen (CN)

(72) Inventors: Guangping Yang, Shenzhen (CN); Yongbing Gao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 290 days.

(21) Appl. No.: 16/121,197

(22) Filed: Sep. 4, 2018

(65) Prior Publication Data

US 2018/0375471 A1 Dec. 27, 2018

Related U.S. Application Data

(63) Continuation of application No. PCT/CN2017/074813, filed on Feb. 24, 2017.

(30) Foreign Application Priority Data

Mar. 1, 2016 (CN) .......................... 201610115556.4

(51) Int. Cl.
*H02S 50/10* (2014.01)
*G01R 19/25* (2006.01)

(52) U.S. Cl.
CPC .......... *H02S 50/10* (2014.12); *G01R 19/2513* (2013.01)

(58) Field of Classification Search
CPC ............................ H02S 50/10; G01R 19/2513
See application file for complete search history.

(56) References Cited

U.S. PATENT DOCUMENTS 9,998,071 B2 * 6/2018 Kouno ..................... H02S 50/00
10,509,068 B2 * 12/2019 Takeuchi ............... G01R 31/66
(Continued)

FOREIGN PATENT DOCUMENTS

CN 102162832 A 8/2011
CN 103633937 A 3/2014
(Continued)

OTHER PUBLICATIONS

Foreign Communication From a Counterpart Application, European Application No. 17759187.2, Extended European Search Report dated Jan. 22, 2019, 6 pages.
(Continued)

*Primary Examiner* — Raymond L Nimox
(74) *Attorney, Agent, or Firm* — Conley Rose, P.C.

(57) ABSTRACT

A method, an apparatus, and a device for identifying a cell string fault in an optoelectronic system, where the method includes obtaining at least two groups of current-voltage (I-V) values of a first cell string in the optoelectronic system, performing fitting processing according to the at least two groups of I-V values using a predetermined physical string model to obtain at least one characteristic parameter of the first cell string, and comparing the at least one characteristic parameter with a pre-obtained standard characteristic parameter to determine whether the first cell string is faulty, or performing curve fitting processing on collected data using the physical string model. Therefore, identifying the cell string fault in the optoelectronic system is not affected by inconsistency of environments, and processing efficiency and accuracy of string fault identification are effectively improved.

30 Claims, 15 Drawing Sheets

(56) References Cited

U.S. PATENT DOCUMENTS

| | | | |
|---|---|---|---|
| 2011/0204900 A1* | 8/2011 | Beck | H02S 50/10 324/537 |
| 2011/0204916 A1* | 8/2011 | Beck | H02S 50/10 324/761.01 |
| 2012/0242320 A1 | 9/2012 | Fischer et al. | |
| 2012/0247542 A1* | 10/2012 | Ammer | H02S 50/10 136/252 |
| 2014/0136129 A1 | 5/2014 | Gokmen et al. | |
| 2016/0218668 A1* | 7/2016 | Kono | H02S 50/00 |

FOREIGN PATENT DOCUMENTS

| | | | |
|---|---|---|---|
| CN | 103701410 | A | 4/2014 |
| CN | 103840742 | A | 6/2014 |
| CN | 103942438 | A | 7/2014 |
| CN | 103944510 | A | 7/2014 |
| CN | 104283512 | A | 1/2015 |
| CN | 104320077 | A | 1/2015 |
| CN | 104778345 | A | 7/2015 |
| CN | 104796082 | A | 7/2015 |
| CN | 204906318 | U | 12/2015 |
| CN | 105827200 | A | 8/2016 |
| EP | 0677749 | A2 | 10/1995 |
| EP | 3091657 | B1 | 8/2018 |

OTHER PUBLICATIONS

Machine Translation and Abstract of Chinese Publication No. CN102162832, Aug. 24, 2011, 9 pages.

Machine Translation and Abstract of Chinese Publication No. CN103633937, Mar. 12, 2014, 9 pages.

Machine Translation and Abstract of Chinese Publication No. CN103840742, Jun. 4, 2014, 16 pages.

Machine Translation and Abstract of Chinese Publication No. CN103942438, Jul. 23, 2014, 19 pages.

Machine Translation and Abstract of Chinese Publication No. CN103944510, Jul. 23, 2014, 16 pages.

Machine Translation and Abstract of Chinese Publication No. CN104283512, Jan. 14, 2015, 13 pages.

Machine Translation and Abstract of Chinese Publication No. CN104320077, Jan. 28, 2015, 10 pages.

Machine Translation and Abstract of Chinese Publication No. CN104778345, Jul. 15, 2015, 18 pages.

Machine Translation and Abstract of Chinese Publication No. CN104796082, Jul. 22, 2015, 14 pages.

Machine Translation and Abstract of Chinese Publication No. CN105827200, Aug. 3, 2016, 48 pages.

Machine Translation and Abstract of Chinese Publication No. CN204906318, Dec. 23, 2015, 6 pages.

Mengnan, D., "Research on Parameter Identification and Aging Fault of a Solar Cell Model," Chinese Master"s Theses Full-text Database Engineering Science and Technology vol. 2, No. 5, May 15, 2015, 14 pages.

English Translation of Mengnan, D., "Research on Parameter Identification and Aging Fault of a Solar Cell Model," Chinese Master"s Theses Full-text Database Engineering Science and Technology vol. 2, No. 5, May 15, 2015, 15 pages.

Foreign Communication From a Counterpart Application, Chinese Application No. 201610115556.4, Chinese Office Action dated Jul. 19, 2017, 24 pages.

Foreign Communication From a Counterpart Application, Chinese Application No. 201610115556.4, Chinese Office Action dated Mar. 8, 2018, 12 pages.

Foreign Communication From a Counterpart Application, Chinese Application No. 201610115556.4, Chinese Office Action dated Aug. 30, 2018, 6 pages.

Foreign Communication From a Counterpart Application, PCT Application No. PCT/CN2017/074813, English Translation of International Search Report dated May 24, 2017, 2 pages.

Foreign Communication From a Counterpart Application, PCT Application No. PCT/CN2017/074813, English Translation of Written Opinion dated May 24, 2017, 5 pages.

* cited by examiner

METHOD, APPARATUS, AND DEVICE FOR IDENTIFYING CELL STRING FAULT IN OPTOELECTRONIC SYSTEM

CROSS-REFERENCE TO RELATED APPLICATIONS

This application is a continuation of International Patent Application No. PCT/CN2017/074813 filed on Feb. 24, 2017, which claims priority to Chinese Patent Application No. 201610115556.4 filed on Mar. 1, 2016. The disclosures of the aforementioned applications are hereby incorporated by reference in their entireties.

TECHNICAL FIELD

Embodiments of this application relate to an optoelectronic technology, and in particular, to a method, an apparatus, and a device for identifying a cell string fault in an optoelectronic system.

BACKGROUND

A solar cell module is a basic unit of an optoelectronic system (or an optoelectronic apparatus) that implements optical-to-electrical conversion, and can convert energy of sunlight into direct current electrical energy. During practical photovoltaic power station application, multiple solar cell modules are usually connected in series to form a cell string, and one or more strings connected in parallel are connected to a grid-tied inverter, and the inverter converts a direct current into an alternating current and merges the alternating current to an alternating current power network.

An output power characteristic of the solar cell module is determined by factors such as a status of the cell module, external illumination intensity, and an ambient temperature. When the cell module is operating, output power may decrease because of an internal unit fault, a light induced degradation characteristic, and the like, or intensity of received light becomes weaker because of blocking, an illumination angle, and the like, or an operating temperature of the module rises because of a poor heat dissipation condition, leading to a decrease in output power. However, a quantity of solar cell modules is extremely large, and a distribution area is relatively large. Therefore, an abnormal string in a power station is relatively difficult to identify. Currently, an output current-voltage (I-V) characteristic of a module may be scanned and tested on site using a dedicated current-voltage I-V scanner to obtain a current I-V curve of a string, and whether there is an abnormal module in the string is determined by manually observing a characteristic of the curve. Alternatively, a tangent slope of each point on the current I-V curve is determined according to the obtained I-V curve (I represents a current and V represents a voltage). A difference between slopes of two adjacent points is compared with a preset value to determine an operating status of the string and perform fault identification on the string.

However, the foregoing first manner, in which a testing time is long and a highly skilled person is required, can be used only for small-quantity sampling detection and cannot completely cover a large power station. A slope of a curve indicates only a characteristic of the curve, and cannot accurately indicate an output characteristic of a cell string. Therefore, accuracy of this fault identification manner is relatively low, and this manner requires extremely high accuracy of a detection parameter, and an error at a specific point causes erroneous determining. In addition, working conditions such as ambient temperatures and irradiance of strings in different locations inside a power station are inconsistent, further reducing the accuracy of the foregoing fault identification manner.

SUMMARY

Embodiments of this application provide a method, an apparatus, and a device for identifying a cell string fault in an optoelectronic system in order to resolve problems that an error of a sampling parameter in a specific working spot causes slope discontinuity, causing erroneous determining of a fault, and fault identification accuracy of cell strings in different locations of a power station is relatively low because of inconsistent working conditions such as ambient temperatures and irradiance.

A first aspect of this application provides a method for identifying a cell string fault in an optoelectronic system, including obtaining at least two groups of current-voltage I-V values of a first cell string in the optoelectronic system, performing fitting processing according to the at least two groups of I-V values and using a predetermined physical string model to obtain at least one characteristic parameter of the first cell string, where the physical string model is used to indicate a relationship between the I-V values of the first cell string and the characteristic parameter of the first cell string, and the characteristic parameter is a constant that is in the physical string model and that is used to indicate a relationship between a current and a voltage that are outputted by the cell string, and separately comparing the at least one characteristic parameter of the first cell string with a standard characteristic parameter corresponding to each characteristic parameter to determine whether the first cell string in the optoelectronic system is a faulty string, where the standard characteristic parameter of the first cell string is a pre-obtained standard value used for comparison with the characteristic parameter of the first cell string.

With reference to the first aspect, in a first possible implementation of the first aspect, the physical string model includes any one of a forward output standard double-diode model, a reverse input standard double-diode model, a forward output single-diode model, a reverse input single-diode model, a half-mathematical and half-physical segment fitting model, or a pure-mathematical fitting model.

With reference to the first possible implementation of the first aspect, in a second implementation of the first aspect, if the physical string model is the half-mathematical and half-physical segment fitting model, the performing fitting processing according to the at least two groups of I-V values and using a predetermined physical string model, to obtain at least one characteristic parameter of the first cell string includes dividing a voltage value range of the first cell string into at least two segments, performing, in each segment, fitting processing according to at least one group of I-V values and using a preset simplified physical model to obtain a characteristic parameter of the first cell string in the segment, and using the characteristic parameter of the first cell string in each segment as the at least one characteristic parameter of the first cell string, where the voltage value range is a range between a short-circuit voltage of the first cell string and any set value that is less than a maximum bearable voltage of the first cell string.

With reference to the first aspect, or the first or the second possible implementation of the first aspect, in a third possible implementation of the first aspect, the standard characteristic parameter of the first cell string includes a first standard characteristic parameter of the first cell string during normal operation and/or a second standard characteristic parameter of the first cell string in each fault case.

With reference to the third possible implementation of the first aspect, in a fourth possible implementation of the first aspect, when the characteristic parameter includes the first standard characteristic parameter, the separately comparing the at least one characteristic parameter of the first cell string with a standard characteristic parameter corresponding to each characteristic parameter to determine whether the first cell string in the optoelectronic system is a faulty string includes separately comparing the at least one characteristic parameter of the first cell string with the first standard characteristic parameter corresponding to each characteristic parameter, where if the at least one characteristic parameter falls in a preset range of the corresponding first standard characteristic parameter, the first cell string is not faulty, or if the at least one characteristic parameter does not fall in a preset range of the corresponding first standard characteristic parameter, the first cell string is a faulty string.

With reference to the third possible implementation of the first aspect or the fourth possible implementation of the first aspect, in a fifth possible implementation of the first aspect, when the characteristic parameter includes the second standard characteristic parameter of the first cell string in each fault case, the separately comparing the at least one characteristic parameter of the first cell string with a standard characteristic parameter corresponding to each characteristic parameter to determine whether the first cell string in the optoelectronic system is a faulty string includes separately comparing the at least one characteristic parameter of the first cell string with the second standard characteristic parameter of the first cell string in each fault case, where if the at least one characteristic parameter of the first cell string falls in a preset range of a second standard characteristic parameter, the first cell string is a faulty string, and a fault type of the first cell string is a fault type corresponding to the second standard characteristic parameter.

With reference to any one of the first aspect or the possible implementations of the first aspect, in a sixth possible implementation of the first aspect, the method further includes determining at least one faulty module from the faulty string.

With reference to the sixth possible implementation of the first aspect, in a seventh possible implementation of the first aspect, the determining at least one faulty module from the faulty string includes determining a faulty module from the faulty string by means of infrared thermal near-end imaging or infrared thermal remote imaging, or determining a faulty module from the faulty string by means of electroluminescence (EL) near-end imaging or EL remote imaging, or determining a faulty module from the faulty string by means of optical near-end imaging or optical remote imaging.

With reference to the seventh possible implementation of the first aspect, in an eighth possible implementation of the first aspect, the determining a faulty module from the faulty string by means of EL near-end imaging or EL remote imaging includes applying a voltage onto the faulty string using an inverter such that the faulty string enters an EL state, and then determining the faulty module in the faulty string by means of near-end imaging or remote imaging.

With reference to any one of the first aspect or the possible implementations of the first aspect, in a ninth possible implementation of the first aspect, the obtaining at least two groups of current-voltage I-V values of a first cell string in the optoelectronic system includes applying a voltage onto the first cell string using the inverter to obtain reversely inputted string I-V values.

With reference to the third possible implementation of the first aspect or the fifth possible implementation of the first aspect, in a tenth possible implementation of the first aspect, the fault type of the first cell string includes at least one of the following types output power of a module in the first cell string is abnormally degraded, potential induced degradation (PID) occurs in a module in the first cell string, a cell unit inside a module in the first cell string fails, current mismatch exists in a module in the first cell string, a hot spot appears in a module in the first cell string, a diode inside a module in the first cell string is short-circuited, a glass panel of a module in the first cell string is broken, an open circuit exists inside a module in the first cell string, or a module in the first cell string is blocked.

With reference to any one of the first aspect or the possible implementations of the first aspect, in an eleventh possible implementation of the first aspect, before separately comparing the at least one characteristic parameter of the first cell string with a standard characteristic parameter corresponding to each characteristic parameter, the method further includes performing fitting processing using the predetermined physical string model, to obtain the first standard characteristic parameter of the first cell string during normal operation and/or the second standard characteristic parameter of the first cell string in each fault case.

A second aspect of the embodiments of this application provides a method for identifying a cell string fault in an optoelectronic system, including obtaining at least two groups of current-voltage I-V values of a first cell string in the optoelectronic system, performing fitting processing according to the at least two groups of I-V values and using a predetermined physical string model, to obtain an actual I-V curve of the first cell string, where the physical string model is used to indicate a relationship between a current and a voltage that are outputted by the first cell, and comparing the actual I-V curve of the first cell string with a pre-obtained standard I-V curve to determine whether the first cell string is a faulty string, where the standard I-V curve is a curve obtained by means of fitting according to I-V values outputted by the first cell string in a normal operating state and using the physical string model.

With reference to the second aspect, in a first possible implementation of the second aspect, the method further includes determining at least one faulty module from the faulty string.

With reference to the second aspect or the first possible implementation of the second aspect, in a second possible implementation of the second aspect, before comparing the actual I-V curve of the first cell string with a pre-obtained standard I-V curve, the method further includes performing fitting processing according to the I-V values of the first cell string and using the predetermined physical string model and a standard characteristic parameter that is used during normal operation to obtain the standard I-V curve of the first cell string.

With reference to the second aspect, the first possible implementation of the second aspect, or the second possible implementation of the second aspect, in a third possible implementation of the second aspect, the comparing the actual I-V curve of the first cell string with a pre-obtained standard I-V curve to determine whether the first cell string is a faulty string includes calculating a difference between the actual I-V curve and the standard I-V curve, and if the difference is greater than a preset difference threshold, determining that the first cell string is a faulty string.

A third aspect of the embodiments of this application provides an apparatus for identifying a cell string fault in an optoelectronic system, including an obtaining module configured to obtain at least two groups of current-voltage I-V values of a first cell string in the optoelectronic system, a first processing module configured to perform fitting processing according to the at least two groups of I-V values and using a predetermined physical string model to obtain at least one characteristic parameter of the first cell string, where the physical string model is used to indicate a relationship between the I-V values of the first cell string and the characteristic parameter of the first cell string, and the characteristic parameter is a constant that is in the physical string model and that is used to indicate a relationship between a current and a voltage that are outputted by the cell string, and a second processing module configured to separately compare the at least one characteristic parameter of the first cell string with a standard characteristic parameter corresponding to each characteristic parameter to determine whether the first cell string in the optoelectronic system is a faulty string, where the standard characteristic parameter of the first cell string is a pre-obtained standard value used for comparison with the characteristic parameter of the first cell string.

A fourth aspect of the embodiments of this application provides an apparatus for identifying a cell string fault in an optoelectronic system, including an obtaining module configured to obtain at least two groups of current-voltage I-V values of a first cell string in the optoelectronic system, a first processing module configured to perform fitting processing according to the at least two groups of I-V values and using a predetermined physical string model to obtain an actual I-V curve of the first cell string, where the physical string model is used to indicate a relationship between a current and a voltage that are outputted by the first cell, and a second processing module configured to compare the actual I-V curve of the first cell string with a pre-obtained standard I-V curve to determine whether the first cell string is a faulty string, where the standard I-V curve is a curve obtained by means of fitting according to I-V values outputted by the first cell string in a normal operating state and using the physical string model.

A fifth aspect of the embodiments of this application provides a device for identifying a cell string fault in an optoelectronic system, including a processor configured to control execution of an executable instruction and a memory configured to store the processor executable instruction, where the processor is configured to obtain at least two groups of current-voltage I-V values of a first cell string in the optoelectronic system, perform fitting processing according to the at least two groups of I-V values and using a predetermined physical string model, to obtain at least one characteristic parameter of the first cell string, where the physical string model is used to indicate a relationship between the I-V values of the first cell string and the characteristic parameter of the first cell string, and the characteristic parameter is a constant that is in the physical string model and that is used to indicate a relationship between a current and a voltage that are outputted by the cell string, and separately compare the at least one characteristic parameter of the first cell string with a standard characteristic parameter corresponding to each characteristic parameter to determine whether the first cell string in the optoelectronic system is a faulty string, where the standard characteristic parameter of the first cell string is a pre-obtained standard value used for comparison with the characteristic parameter of the first cell string.

With reference to the fifth aspect, in a first possible implementation of the fifth aspect, if the physical string model is a half-mathematical and half-physical segment fitting model, the processor is further configured to divide a voltage value range of the first cell string into at least two segments, perform, in each segment, fitting processing according to at least one group of I-V values and using a preset simplified physical model to obtain a characteristic parameter of the first cell string in the segment, and use the characteristic parameter of the first cell string in each segment as the at least one characteristic parameter of the first cell string, where the voltage value range is a range between a short-circuit voltage of the first cell string and any set value that is less than a maximum bearable voltage of the first cell string.

With reference to the fifth aspect or the first possible implementation of the fifth aspect, in a second possible implementation of the fifth aspect, the standard characteristic parameter that is of the first cell string and that is obtained by the processor includes a first standard characteristic parameter of the first cell string during normal operation and/or a second standard characteristic parameter of the first cell string in each fault case.

With reference to the second possible implementation of the fifth aspect, in a third possible implementation of the fifth aspect, when the characteristic parameter includes the first standard characteristic parameter, the processor is further configured to separately compare the at least one characteristic parameter of the first cell string with the first standard characteristic parameter corresponding to each characteristic parameter, where if the at least one characteristic parameter falls in a preset range of the corresponding first standard characteristic parameter, the first cell string is not faulty, or if the at least one characteristic parameter does not fall in a preset range of the corresponding first standard characteristic parameter, the first cell string is a faulty string.

With reference to the second or the third possible implementation of the fifth aspect, in a fifth possible implementation of the fifth aspect, when the characteristic parameter includes the second standard characteristic parameter of the first cell string in each fault case, the processor is further configured to separately compare the at least one characteristic parameter of the first cell string with the second standard characteristic parameter of the first cell string in each fault case, where if the at least one characteristic parameter of the first cell string falls in a preset range of a second standard characteristic parameter, the first cell string is a faulty string, and a fault type of the first cell string is a fault type corresponding to the second standard characteristic parameter.

With reference to any one of the fifth aspect or the possible implementations of the fifth aspect, in a fifth possible implementation of the fifth aspect, the processor is further configured to determine at least one faulty module from the faulty string.

The processor is further configured to determine a faulty module from the faulty string by means of infrared thermal near-end imaging or infrared thermal remote imaging, or determine a faulty module from the faulty string by means of EL near-end imaging or EL remote imaging, or determine a faulty module from the faulty string by means of optical near-end imaging or optical remote imaging.

With reference to the sixth possible implementation of the fifth aspect, in a seventh possible implementation of the fifth aspect, the processor is further configured to control an inverter to apply a voltage onto the faulty string such that the faulty string enters an EL state, and then determine the faulty module in the faulty string by means of near-end imaging or remote imaging.

With reference to any one of the fifth aspect or the possible implementations of the fifth aspect, in an eighth possible implementation of the fifth aspect, the processor is further configured to apply a voltage onto the first cell string using the inverter to obtain reversely inputted string I-V values.

Optionally, the fault type that is of the first cell string and that is obtained by the processor includes at least one of the following types output power of a module in the first cell string is abnormally degraded, PID occurs in a module in the first cell string, a cell unit inside a module in the first cell string fails, current mismatch exists in a module in the first cell string, a hot spot appears in a module in the first cell string, a diode inside a module in the first cell string is short-circuited, a glass panel of a module in the first cell string is broken, an open circuit exists inside a module in the first cell string, or a module in the first cell string is blocked.

With reference to any one of the fifth aspect or the possible implementations of the fifth aspect, in an ninth possible implementation of the fifth aspect, the processor is further configured to perform fitting processing using the predetermined physical string model, to obtain the first standard characteristic parameter of the first cell string during normal operation and/or the second standard characteristic parameter of the first cell string in each fault case.

A sixth aspect of the embodiments of this application provides a device for identifying a cell string fault in an optoelectronic system, including a processor configured to control execution of an executable instruction and a memory configured to store the processor executable instruction, where the processor is configured to obtain at least two groups of current-voltage I-V values of a first cell string in the optoelectronic system, perform fitting processing according to the at least two groups of I-V values and using a predetermined physical string model to obtain an actual I-V curve of the first cell string, where the physical string model is used to indicate a relationship between a current and a voltage that are outputted by the first cell, and compare the actual I-V curve of the first cell string with a pre-obtained standard I-V curve to determine whether the first cell string is a faulty string, where the standard I-V curve is a curve obtained by means of fitting according to I-V values outputted by the first cell string in a normal operating state and using the physical string model.

With reference to the sixth aspect, in a first possible implementation of the sixth aspect, the processor is further configured to determine at least one faulty module from the faulty string.

With reference to the sixth aspect or the first possible implementation of the sixth aspect, in a second possible implementation of the sixth aspect, the processor is further configured to perform fitting processing according to the I-V values of the first cell string and using the predetermined physical string model and a standard characteristic parameter that is used during normal operation, to obtain the standard I-V curve of the first cell string.

With reference to any one of the sixth aspect or the possible implementations of the sixth aspect, in a third possible implementation of the sixth aspect, the processor is further configured to calculate a difference between the actual I-V curve and the standard I-V curve, and if the difference is greater than a preset difference threshold, determine that the first cell string is a faulty string.

According to the method, the apparatus, and the device for identifying a cell string fault in an optoelectronic system provided in this application, at least two groups of I-V values of a first cell string in the optoelectronic system are obtained, fitting processing is performed according to obtained data and using a predetermined physical string model to obtain at least one characteristic parameter of the first cell string, and then the characteristic parameter is compared with a pre-obtained standard characteristic parameter of the cell string to determine whether the first cell string is a faulty string, and by analogy, each cell string in the optoelectronic system is detected in this manner, that is, curve fitting processing is performed on collected data using the physical string model. This solution may be widely applied to a large power station. When a characteristic parameter, which is obtained after all actually measured data of a cell string is comprehensively processed, is compared with a standard characteristic parameter used when there is no fault, a test error at a specific point does not cause erroneous determining, and determining is not dependent on an environment. Therefore, this solution is not affected by inconsistency of environments, and processing efficiency and accuracy of cell string fault identification are effectively improved. Further, a calculated characteristic parameter of a faulty cell module may also be compared with a preset fault characteristic parameter in order to determine a fault type of the fault cell module.

DESCRIPTION OF EMBODIMENTS

To make the objectives, technical solutions, and advantages of the embodiments of this application clearer, the following clearly and describes the technical solutions in the embodiments of this application with reference to the accompanying drawings in the embodiments of this application. The described embodiments are merely some rather than all of the embodiments of this application. All other embodiments obtained by a person of ordinary skill in the art based on the embodiments of this application without creative efforts shall fall within the protection scope of this application.

Figure 1:
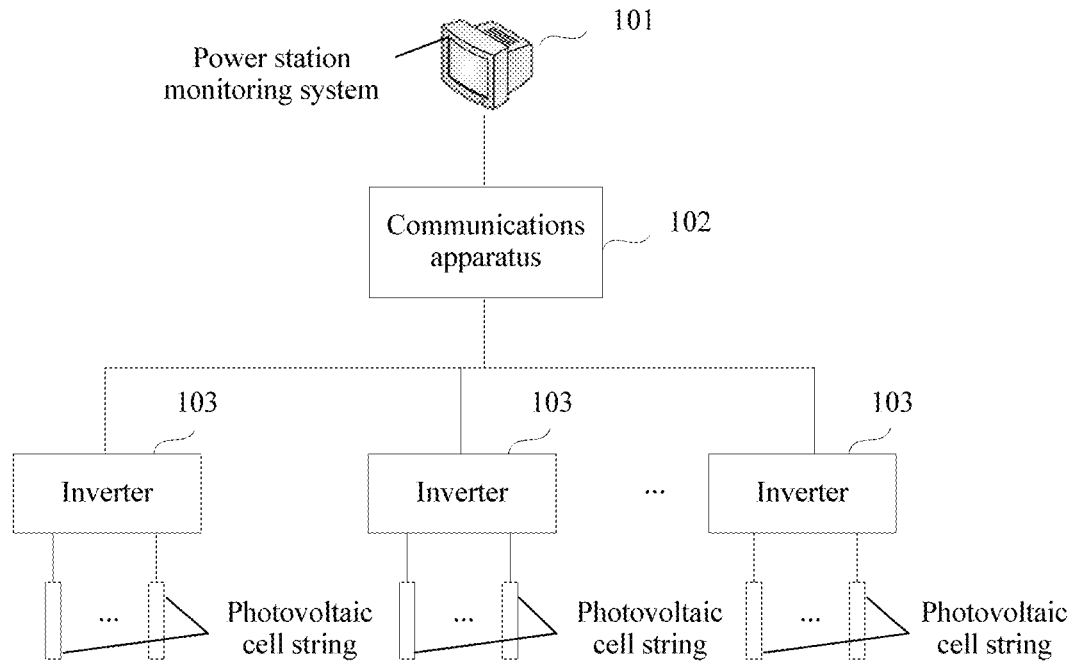
FIG. 1 is a schematic diagram of application networking according to an embodiment of this application.

FIG. 1 is a schematic diagram of application networking of an embodiment of this application, including a power station monitoring system 101, a communications apparatus 102, and several inverters 103. As shown in FIG. 1, each inverter 103 is connected to a to-be-detected photovoltaic cell string. The communications apparatus 102 may be, for example, a data collector. One end of the communications apparatus 102 is configured to connect to each inverter 103 using a communications interface, and the other end of the communications apparatus 102 is configured to connect to the power station monitoring system 101. The communications apparatus 102 is responsible for transmitting, to the power station monitoring system 101, data collected by the inverter 103. The power station monitoring system 101 is configured to send an instruction to each inverter 103 using the communications apparatus 102, and analyze and process received data that is sent by the communications apparatus 102.

Based on the foregoing networking manner, in this solution, I-V values obtained after a subarray cell string in an optoelectronic system is scanned may be used for analysis and processing to perform fault locating. When a fault occurs in one or more modules in a cell string, "deformation" (that a point is deviated from a curve) occurs in an I-V curve outputted by the cell string. By analyzing current and voltage data outputted by the cell string and obtaining a characteristic parameter of the deformation of the curve, a cell string that has a faulty module and is in an optoelectronic apparatus (that is, an optoelectronic system) can be effectively identified, that is, locating of the cell string that has a faulty module is rapidly completed, and a fault type may further be determined. Accuracy of a result obtained from the analysis and processing is relatively high. The technical solutions provided in this application are described below in detail with reference to embodiments.

Figure 2:
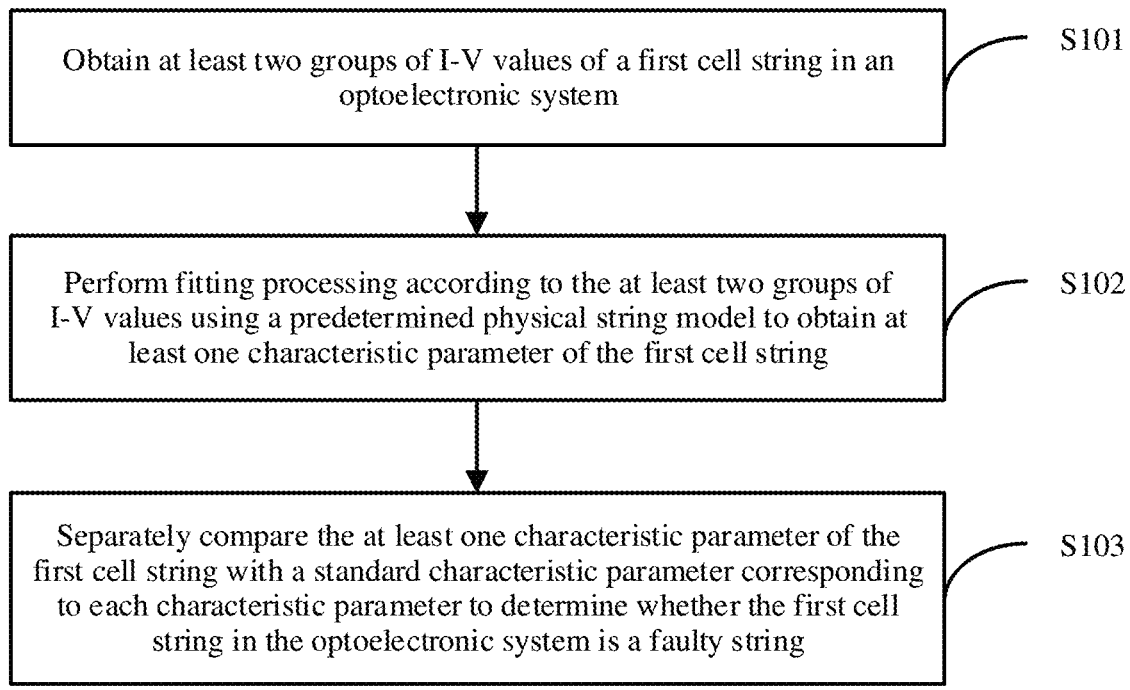
FIG. 2 is a flowchart of Embodiment 1 of a method for identifying a cell string fault in an optoelectronic system according to this application.

FIG. 2 is a flowchart of Embodiment 1 of a method for identifying a cell string fault in an optoelectronic system according to this application. As shown in FIG. 2, the solution is performed by any apparatus having calculation and storage functions in a photovoltaic power generation system, for example, a power station monitor, a data collector, an inverter, a smart combiner box, or another smart apparatus such as a computer that has a communication connection to and exchanges data with the photovoltaic power generation system. Specific implementation steps of the method for identifying a cell string fault in an optoelectronic system are as follows.

Step S101. Obtain at least two groups of I-V values of a first cell string in the optoelectronic system.

In this step, to complete identification on each cell string, at least two groups of I-V values need to be obtained for each cell string in order to perform fitting processing in a subsequent step according to a model. Current and voltage values of each cell string may be obtained by performing IV scanning on the cell string. The current and the voltage herein are a group of corresponding data, that is, each current value corresponds to one voltage value.

Although at least two groups of I-V values are specified above, to improve accuracy of an analysis result in an actual application process, a higher quantity of required I-V values is preferred.

The following uses the first cell string as an example to describe the solution provided in this application. For the first cell string, current and voltage values of each cell string may be obtained by performing IV scanning on the first cell string.

Optionally, a voltage may be applied onto the first cell string using the inverter, to obtain reversely inputted string I-V values.

Step S102. Perform fitting processing according to the at least two groups of I-V values using a predetermined physical string model to obtain at least one characteristic parameter of the first cell string.

In this step, the physical string model is used to indicate a relationship between the I-V values of the first cell string and the characteristic parameter of the first cell string, and the characteristic parameter is a constant that is in the physical string model and that is used to indicate a relationship between a current and a voltage that are outputted by the cell string.

For multiple groups of I-V values of the first cell string, fitting may be performed using a predetermined physical string model to obtain a group of characteristic parameters that can directly present a characteristic of the first cell string. A frequently-used physical string model includes but is not limited to any one of the following models a forward output standard double-diode model, a reverse input standard double-diode model, a forward output single-diode model, a reverse input single-diode model, or a half-mathematical and half-physical segment fitting model. At least one characteristic parameter or an actual I-V curve of a cell string is obtained by performing, based on the predetermined physical string model, fitting processing using mathematical fitting algorithms such as the Levenberg-Marquardt algorithm and the Gauss-Newton algorithm.

Step S103. Separately compare the at least one characteristic parameter of the first cell string with a standard characteristic parameter corresponding to each characteristic parameter to determine whether the first cell string in the optoelectronic system is a faulty string.

In this step, the standard characteristic parameter of the first cell string is a pre-obtained standard value used for comparison with the characteristic parameter of the first cell string.

One or more characteristic parameters that correspond to the first cell string and that are obtained according to any one of the foregoing physical string models are compared with a pre-obtained standard characteristic parameter to determine whether the cell string is a faulty string, and by analogy, each cell string is detected in this manner until all faulty strings in the optoelectronic system are located.

In a specific implementation, the standard characteristic parameter may include a first standard characteristic parameter of the first cell string during normal operation and/or a second standard characteristic parameter of the first cell string in each fault case. If the standard characteristic parameter of the first cell string includes only the first standard characteristic parameter that is used during normal operation, that is, a characteristic parameter of the first cell string without a fault, after an actual characteristic parameter is obtained according to actually measured I-V values of the cell string, the actual characteristic parameter is compared with the first standard characteristic parameter. If the actual characteristic parameter falls in an error range of the first standard characteristic parameter, it is considered that the first cell string is not faulty, or if a difference between the actual characteristic parameter and the first standard characteristic parameter is relatively large, it is considered that there is a faulty module in the first cell string.

Alternatively, according to an outputted I-V characteristic defined in a specification of a module used in the first cell string, fitting processing is performed using the predetermined physical string model to obtain a first standard characteristic parameter that indicates that the first cell string is in normal operation. A fault case in the first cell string is simulated to test an output I-V curve of the first cell string when the first cell string is faulty. Fitting processing is performed using the predetermined physical string model to obtain a second standard characteristic parameter that indicates that the first cell string is in each fault case.

Optionally, if the standard characteristic parameter includes the second standard characteristic parameter of the first cell string in each fault case, determining a faulty string in the optoelectronic system includes determining a fault type of the faulty string according to the at least one characteristic parameter of the first cell string and the second standard characteristic parameter of the first cell string in each fault case.

In the foregoing solution, if the standard characteristic parameter of the first cell string includes the second standard characteristic parameter of the first cell string in each fault case, an obtained actual characteristic parameter is compared with each second standard characteristic parameter, and if there is an actual characteristic parameter of the first cell string that is similar to a second standard characteristic parameter, it is considered that the first cell string is a faulty string, and it may be determined that the fault type is a fault corresponding to the second standard characteristic parameter. That is, in this solution, not only the faulty string can be identified, but also the fault type of the first cell string can be determined.

Optionally, the fault (that is, the fault type) of the first cell string includes but is not limited to at least one of output power of a module in the first cell string is abnormally degraded, PID occurs in a module in the first cell string, a cell unit inside a module in the first cell string fails, current mismatch exists in a module in the first cell string, a hot spot appears in a module in the first cell string, a diode inside a module in the first cell string is short-circuited, a glass panel of a module in the first cell string is broken, an open circuit exists inside a module in the first cell string, or a module in the first cell string is partially or completely blocked.

In the foregoing manner, all cell strings in an optoelectronic apparatus or an optoelectronic system may be traversed to locate all faulty cell strings in order to fast locate a cell string that has a faulty module.

According to the method for identifying a cell string fault in an optoelectronic system provided in this embodiment, at least two groups of I-V values of a first cell string in the optoelectronic system are obtained, fitting processing is performed according to obtained data and using a predetermined physical string model to obtain at least one characteristic parameter of the first cell string, and then the characteristic parameter is compared with a pre-obtained standard characteristic parameter of the cell string to determine whether the cell string is a faulty string, and by analogy, each cell string in the optoelectronic system is detected in this manner, that is, curve fitting processing is performed on collected data using the physical string model. This solution may be widely applied to a large power station. When a characteristic parameter, which is obtained after all actually measured data of a cell string is comprehensively processed, is compared with a standard characteristic parameter used when there is no fault, a test error at a specific point does not cause erroneous determining, and determining is not dependent on an environment. Therefore, this solution is not affected by inconsistency of environments, and processing efficiency and accuracy of cell string fault identification are effectively improved.

Based on the foregoing embodiment, in this solution, a specific faulty module may further be located from each faulty string. A specific implementation is provided below for detailed description of another embodiment of a method for identifying a cell string fault in an optoelectronic system provided in this application.

Figure 3:
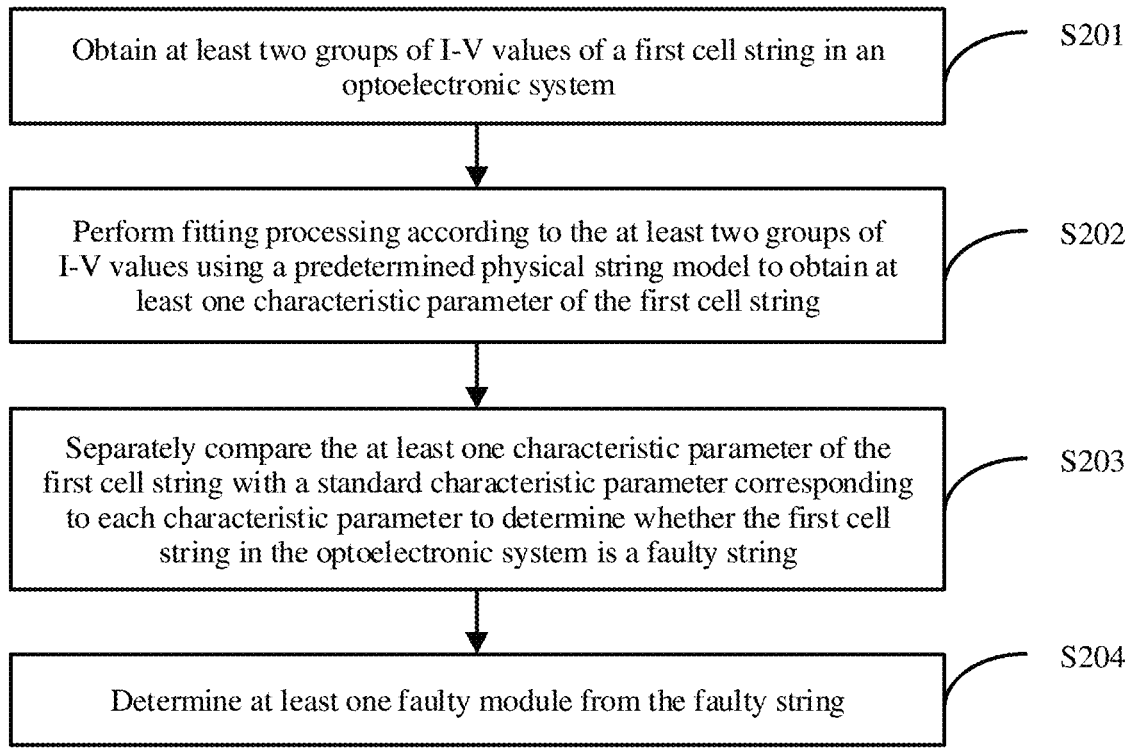
FIG. 3 is a flowchart of Embodiment 2 of a method for identifying a cell string fault in an optoelectronic system according to this application.

FIG. 3 is a flowchart of Embodiment 2 of a method for identifying a cell string fault in an optoelectronic system according to this application. As shown in FIG. 3, steps of another specific implementation of the method for identifying a cell string fault in an optoelectronic system include the following steps.

Step S201. Obtain at least two groups of I-V values of a first cell string in the optoelectronic system.

Step S202. Perform fitting processing according to the at least two groups of I-V values using a predetermined physical string model to obtain at least one characteristic parameter of the first cell string.

At least one characteristic parameter or an actual I-V curve of a cell string is obtained by performing, based on the predetermined physical string model, fitting processing using mathematical fitting algorithms such as the Levenberg-Marquardt algorithm and the Gauss-Newton algorithm.

Step S203. Separately compare the at least one characteristic parameter of the first cell string with a standard characteristic parameter corresponding to each characteristic parameter to determine whether the first cell string in the optoelectronic system is a faulty string.

In a specific implementation, before step S203, fitting processing needs to be performed using the predetermined physical string model, to obtain a first standard characteristic parameter of the first cell string during normal operation and/or a second standard characteristic parameter of the first cell string in each fault case.

Optionally, after the faulty module is determined, a fault type of the faulty string may be determined according to the at least one characteristic parameter of the first cell string and the second standard characteristic parameter of the first cell string in each fault case.

With reference to the foregoing embodiment, that the at least one characteristic parameter of the first cell string is compared with the standard characteristic parameter of the first cell string includes at least the following manners.

When the characteristic parameter includes the first standard characteristic parameter, the separately comparing the at least one characteristic parameter of the first cell string with a standard characteristic parameter corresponding to each characteristic parameter, to determine whether the first cell string in the optoelectronic system is a faulty string includes separately comparing the at least one characteristic parameter of the first cell string with the first standard characteristic parameter corresponding to each characteristic parameter, where if the at least one characteristic parameter falls in a preset range of the corresponding first standard characteristic parameter, the first cell string is not faulty, or if the at least one characteristic parameter does not fall in a preset range of the corresponding first standard characteristic parameter, the first cell string is a faulty string.

When the characteristic parameter includes the second standard characteristic parameter of the first cell string in each fault case, separately comparing the at least one characteristic parameter of the first cell string with a standard characteristic parameter corresponding to each characteristic parameter, to determine whether the first cell string in the optoelectronic system is a faulty string includes separately comparing the at least one characteristic parameter of the first cell string with the second standard characteristic parameter of the first cell string in each fault case.

If the at least one characteristic parameter of the first cell string falls in a preset range of a second standard characteristic parameter, the first cell string is a faulty string, and a fault type of the first cell string is a fault type corresponding to the second standard characteristic parameter.

In addition, if the characteristic parameter includes both the first standard characteristic parameter and the second standard characteristic parameter, the characteristic parameter may be first compared with the first standard characteristic parameter to determine whether the first cell string is faulty, and then compared with each second standard characteristic parameter to determine the fault type of the first cell string.

Step S204. Determine at least one faulty module from the faulty string.

In this step, after a faulty string in the optoelectronic system is located, a faulty module in the faulty string may be further determined, and a specific implementation includes at least the following manners.

In a first manner, a faulty module is determined from the faulty string by means of infrared thermal near-end imaging or infrared thermal remote imaging.

The faulty module is determined from the faulty string by means of infrared thermal imaging using short-distance shooting or drone long-distance shooting.

In a second manner, a faulty module is determined from the faulty string by means of EL near-end imaging or EL remote imaging.

In a specific implementation of this manner, an inverter applies a reverse voltage onto the faulty string, and then the faulty module in the faulty string is determined by means of near-end imaging or remote imaging. That is, the inverter applies a controllable reverse voltage onto the cell string to implement EL detection, and a specific imaging manner may be remote imaging or near-end imaging.

In a third manner, a faulty module is determined from the faulty string by means of optical near-end imaging or optical remote imaging.

In this embodiment of this application, a fault in the cell string is actually a fault in a module in the cell string, and refers to an abnormal state in which output power of a module decreases during actual application. The abnormal state includes but is not limited to a state in which output power of a module is abnormally degraded, a state in which a single cell unit inside a module fails, a state in which a connection line of an internal cell unit is disconnected or connection impedance increases, a state in which a module is partially or completely blocked, a state in which an operating temperature of a module is excessively high, and the like.

According to the method for identifying a cell string fault in an optoelectronic system provided in this embodiment, at least two groups of I-V values of each string in the optoelectronic system are obtained, fitting processing is performed according to obtained data and using a predetermined physical string model, to obtain at least one characteristic parameter of each cell string, and then the characteristic parameter is compared with a pre-obtained standard characteristic parameter of the cell string to determine whether the cell string is a faulty string, and a faulty module is further located from the faulty string. On the basis of effectively improving accuracy of cell string fault identification, processing efficiency of fault identification is further improved, and fast locating is implemented.

Based on any one of the foregoing embodiments, several physical string models and implementation principles thereof are described in detail below.

1. Forward output standard double-diode model.

Figure 4:
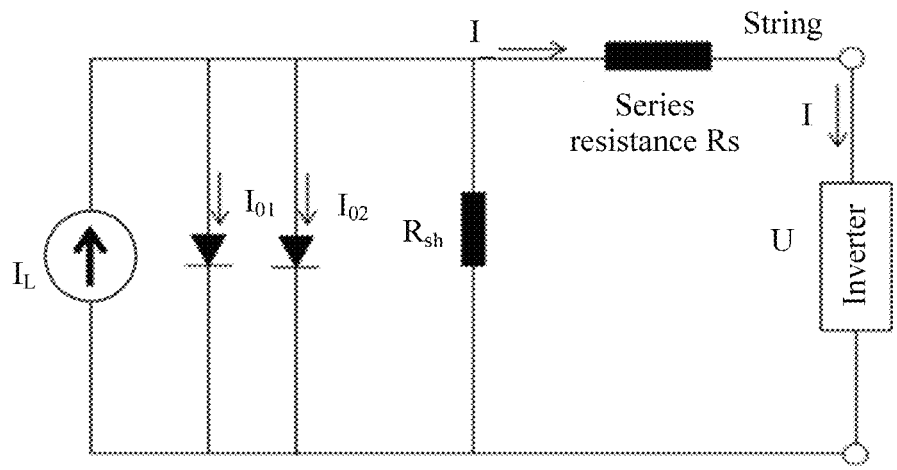
FIG. 4 is a schematic circuit diagram of a forward standard double-diode model.

FIG. 4 is a schematic circuit diagram of a forward standard double-diode model. A data model obtained according to a circuit in FIG. 4 is:

$$I = I_L - I_{01}\left\{\exp\left[\frac{q(V+IR_S)}{kT}\right]-1\right\} - I_{02}\left\{\exp\left[\frac{q(V+IR_S)}{kT}\right]-1\right\} - \frac{V+IR_S}{R_{sh}},$$

where:

I: Cell string operating current;
$I_L$: Photo-generated current, which may be replaced by a short-circuit current during calculation;
$I_{01}$: Saturation current of an equivalent diode 1 in the double-diode model;
exp: Exponential function whose base is a natural constant e;
q: Charge constant ($1.6E^{-19}$ coulombs (C));
V: Cell string operating voltage;
Rs: Cell string series resistance;
k: Boltzmann constant, $1.38e^{-23}$ joules per kelvin (J/K);

T: Cell string temperature (kelvin (K));

$I_{02}$: Saturation current of an equivalent diode 2 in the double-diode model; and Rsh: Cell string parallel resistance.

Characteristic parameters $I_{01}$, $I_{02}$, Rs, and Rsh of the cell string are obtained by means of fitting using the foregoing model and according to multiple I-V values (or an I-V curve) obtained by means of scanning in daytime. The characteristic parameters of a curve that are obtained by means of fitting using the I-V values are compared with a standard parameter in an ideal state to determine a difference, and a series of mapping relationships are formed. Cell string fault identification is implemented using a mapping relationship between a standard parameter and a cell string fault.

2. Forward output single-diode model.

Figure 5:
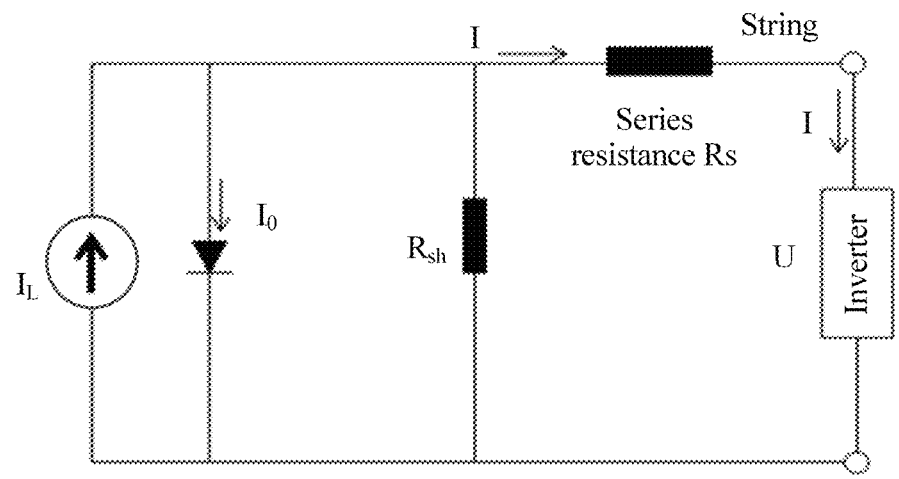
FIG. 5 is a schematic circuit diagram of a forward single-diode model.

FIG. 5 is a schematic circuit diagram of a forward single-diode model. A data model obtained according to a circuit in FIG. 5 is:

$$I = I_L - I_0\left\{\exp\left[\frac{q(V+IR_S)}{nkT}\right] - 1\right\} - \frac{V+IR_S}{R_{sh}},$$

where:

I: Cell string operating current;

$I_L$: Photo-generated current, which may be replaced by a short-circuit current during calculation;

$I_0$: Saturation current of an equivalent diode in the single-diode model;

exp: Exponential function whose base is a natural constant e;

q: Charge constant ($1.6E^{-19}$ C);

V: Cell string operating voltage;

Rs: Cell string series resistance;

n: Ideal factor of an equivalent circuit diode in the single diode;

k: Boltzmann constant, $1.38e^{-23}$ J/K;

T: Cell string temperature (K); and

Rsh: Cell string parallel resistance.

Characteristic parameters $I_0$, n, Rs, and Rsh of the cell string are obtained by means of fitting using the single-diode model and according to I-V values (an I-V curve) obtained by means of scanning in daytime. The curve obtained by means of fitting is compared with I-V data to determine a difference in order to obtain a characteristic parameter of an ideal curve and a characteristic parameter obtained by fitting actually measured data, and a series of mappings are formed. Cell string fault identification is implemented using a mapping relationship between a standard parameter and a cell string fault.

3. Reverse input standard double-diode model.

Figure 6:
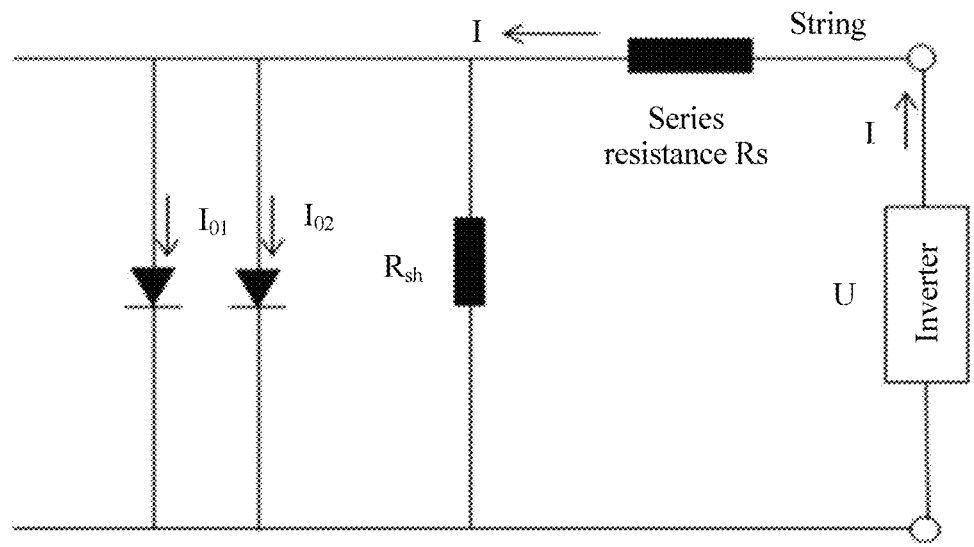
FIG. 6 is a schematic circuit diagram of a reverse input standard double-diode model.

FIG. 6 is a schematic circuit diagram of a reverse input standard double-diode model in which a voltage is externally applied onto a cell string. A data model obtained according to a circuit in FIG. 6 is:

$$I = I_{01}\left\{\exp\left[\frac{q(V-IR_S)}{kT}\right] - 1\right\} + I_{02}\left\{\exp\left[\frac{q(V-IR_S)}{kT}\right] - 1\right\} + \frac{V+IR_S}{R_{sh}},$$

where:

I: Cell string current;

$I_{01}$: Saturation current of an equivalent diode 1 in the double-diode model;

exp: Exponential function whose base is a natural constant e;

q: Charge constant ($1.6E^{-19}$ C);

V: Cell string voltage;

Rs: Cell string series resistance;

k: Boltzmann constant, $1.38e^{-23}$ J/K;

T: Cell string temperature (K);

$I_{02}$: Saturation current of an equivalent diode 2 in the double-diode model; and Rsh: Cell string parallel resistance.

Characteristic parameters $I_{01}$, $I_{02}$, Rs, and Rsh of the cell string are obtained by means of fitting using the standard double-diode model and according to I-V values (an I-V curve) obtained by means of scanning at nighttime after a voltage is externally applied onto a module. The curve obtained by means of fitting is compared with I-V data to determine a difference in order to obtain a characteristic parameter of an ideal curve and a characteristic parameter obtained by fitting actually measured data, and a series of mappings are formed. Cell string fault identification is implemented using a mapping relationship between a standard parameter and a cell string fault.

4. Reverse input single-diode model.

Figure 7:
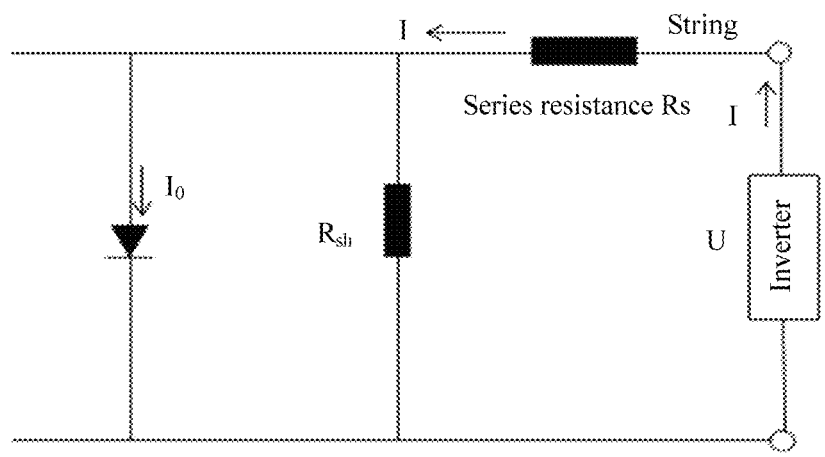
FIG. 7 is a schematic circuit diagram of a reverse input single-diode model.

FIG. 7 is a schematic circuit diagram of a single-diode model in which a voltage is externally applied onto a cell string. A data model obtained according to a circuit in FIG. 7 is:

$$I = I_0\left\{\exp\left[\frac{q(V-IR_S)}{nkT}\right] - 1\right\} + \frac{V+IR_S}{R_{sh}},$$

where:

I: Cell string current, which is a current obtained by means of testing with different voltages;

V: Cell string voltage, which is a voltage externally applied onto a cell string in a test;

$I_L$: Photo-generated current, which may be replaced by a short-circuit current during calculation;

$I_0$: Saturation current of an equivalent diode in the single-diode model;

exp: Exponential function whose base is a natural constant e;

q: Charge constant ($1.6E^{-19}$ C);

Rs: Cell string series resistance;

n: Ideal factor of an equivalent circuit diode in the single diode;

k: Boltzmann constant, $1.38e^{-23}$ J/K;

T: Cell string temperature (K); and

Rsh: Cell string parallel resistance.

Characteristic parameters $I_0$, n, Rs, and Rsh of the cell string are obtained by means of fitting using the model and according to I-V values (an I-V curve) obtained by means of scanning at nighttime after a voltage is externally applied onto a module, and a series of mapping parameters are formed. Cell string fault identification is implemented using mapping relationships between the mapping parameters and a cell string fault.

5. Half-mathematical and half-physical segment fitting model.

Figure 8A:
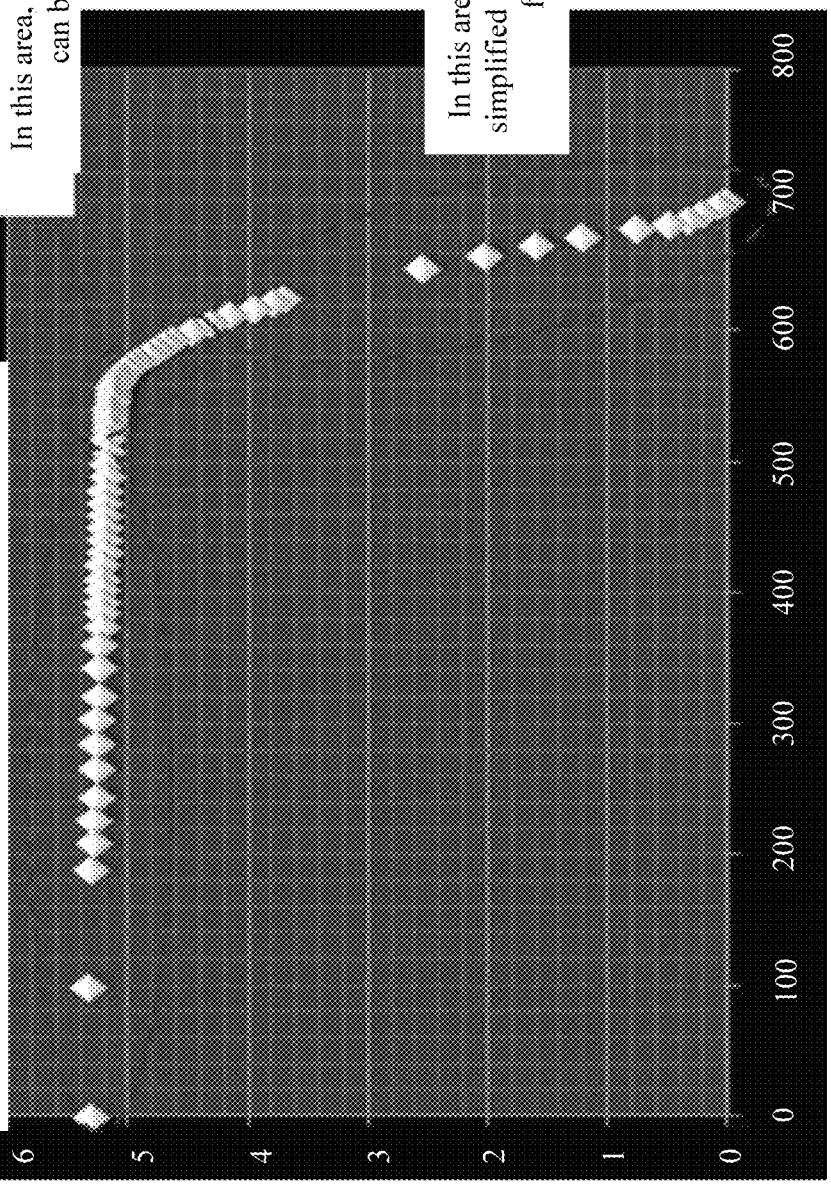
FIG. 8A is a schematic diagram of a fitting instance of a half-mathematical and half-physical segment fitting model.

FIG. 8A is a schematic diagram of a fitting instance of a half-mathematical and half-physical segment fitting model. As shown in FIG. 8A, in a half-mathematical and half-physical fitting manner, an I-V curve is divided into three segments to simplify the fitting model in order to perform fitting processing and obtain a characteristic parameter of each segment. Three types of fitting equations shown in FIG. 8a are as follows:

$$I = -\frac{1}{R_{sh}}V + I_{sc},$$ Equation 1 where:
I: Cell string operating current;
$I_{sc}$: Cell string short-circuit current;
V: Cell string operating voltage; and
Rsh: Cell string parallel resistance.

$$I = I_L - I_0\left\{\exp\left[\frac{q(V + IR_S)}{nkT}\right] - 1\right\} - \frac{V + IR_S}{R_{sh}},$$ Equation 2 where:
I: Cell string operating current;
$I_L$: Photo-generated current, which may be replaced by a short-circuit current during calculation;
$I_0$: Saturation current of an equivalent diode in the single-diode model;
exp: Exponential function whose base is a natural constant e;
q: Charge constant (1.6E$^{-19}$ C);
V: Cell string operating voltage;
Rs: Cell string series resistance;
n: Ideal factor of an equivalent circuit diode in the single diode;
k: Boltzmann constant, 1.38e$^{-23}$ J/K;
T: Cell string temperature (K); and
Rsh: Cell string parallel resistance.

$$V = \frac{nk_BT}{q}\ln\left(\frac{I_{sc} - I}{I_0} + 1\right) - R_s I,$$ Equation 3 where:
V: Cell string operating voltage;
n: Ideal factor of an equivalent circuit diode in the single diode;
$k_B$: Boltzmann constant, 1.38e$^{-23}$ J/K;
T: Cell string temperature (K);
q: Charge constant (1.6E$^{-19}$ C);
ln: Natural logarithm symbol;
$I_{sc}$: Cell string short-circuit current;
I: Cell string operating current;
$I_0$: Saturation current of an equivalent diode in the single-diode model; and
Rs: Cell string series resistance.

With reference to the foregoing three equations, I-V values of a cell string that are obtained by means of scanning are segmented using the half-mathematical and half-physical segment fitting model. Fitting processing is separately performed, using at least two predetermined characteristic equations, on two groups of data obtained from the segmenting, to obtain at least one characteristic parameter of the cell string. The at least one characteristic parameter includes $I_0$, an ideal factor n, a series resistance Rs, and a parallel resistance Rsh that are of the cell string. A curve obtained by means of fitting is compared with I-V data to determine a difference in order to obtain a characteristic parameter of an ideal curve and a characteristic parameter obtained by fitting actually measured data, and a series of mappings are formed. Cell string fault identification is implemented using a mapping relationship between a standard parameter and a cell string fault.

6. Pure-mathematical fitting model.

Figure 8B:
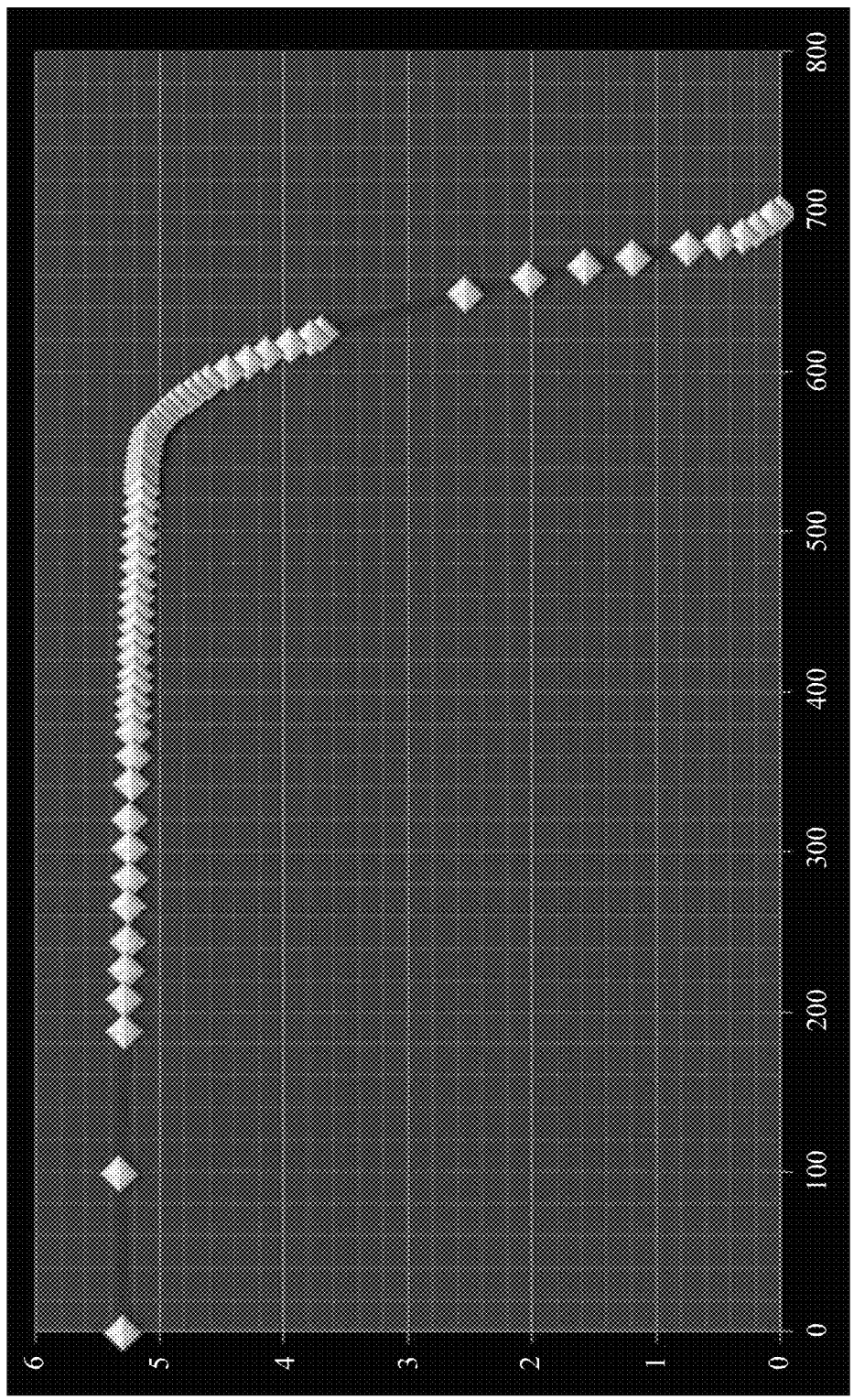
FIG. 8B is a schematic diagram of polynomial fitting in a pure-mathematical fitting model.

FIG. 8B is a schematic diagram of polynomial fitting in a pure-mathematical fitting model. Fitting is performed using a pure-mathematical polynomial function, and perfect fitting is performed on I-V data to obtain a series of parameters a0, a1, and a2. The obtained series of parameters and actually measured data are fitted and used as characteristic parameters. Cell string fault identification is implemented according to statistical relationships between the characteristic parameters and a fault mapping of the cell string, where $f(x) = a0 + a1(x-x1) + a2(x-x2)^2 + a3(x-x3)^3 + \ldots$, where f(x) indicates output of a function and may be set to I herein, x is input of the function and may be set to V, and a0, a1, a2, a3, ..., x1, x2, x3, ... are characteristic parameter constants of the fitting function.

Fitting is performed on an I-V curve using a mathematical formula. Assuming that x in the formula is a voltage V and f(x) is I, the I-V curve may be expressed by means of in an infinite approaching manner using a mathematical polynomial function.

With reference to the descriptions of the foregoing models, an example is used below to describe a method for identifying a cell string fault in an optoelectronic system of this application.

Figure 9A:
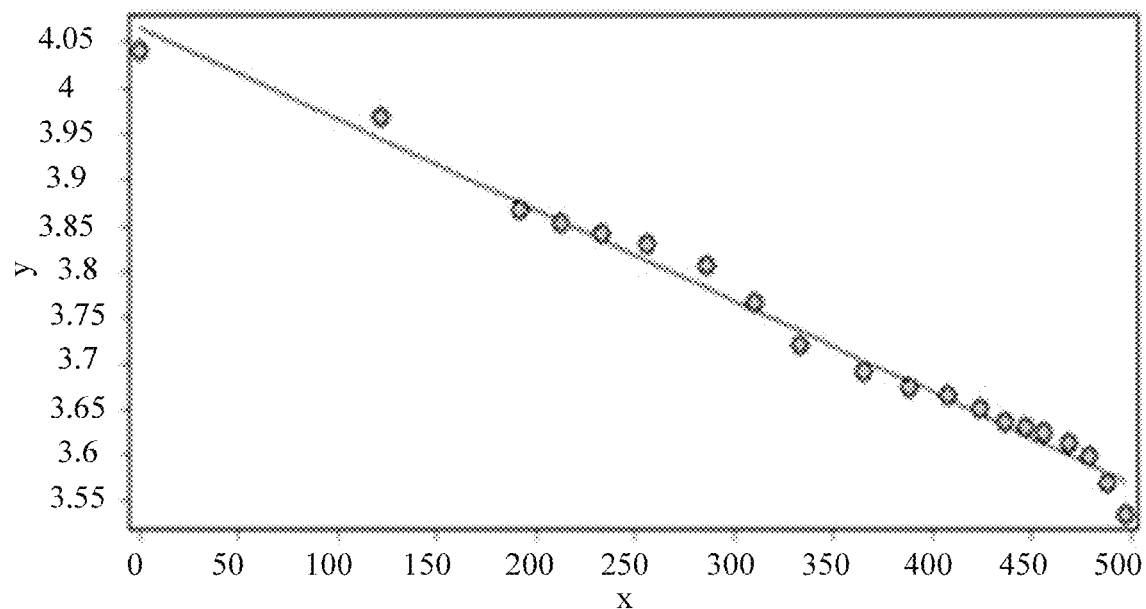
FIG. 9A is a schematic diagram of an I-V curve when there is no faulty module in a cell string.
Figure 9B:
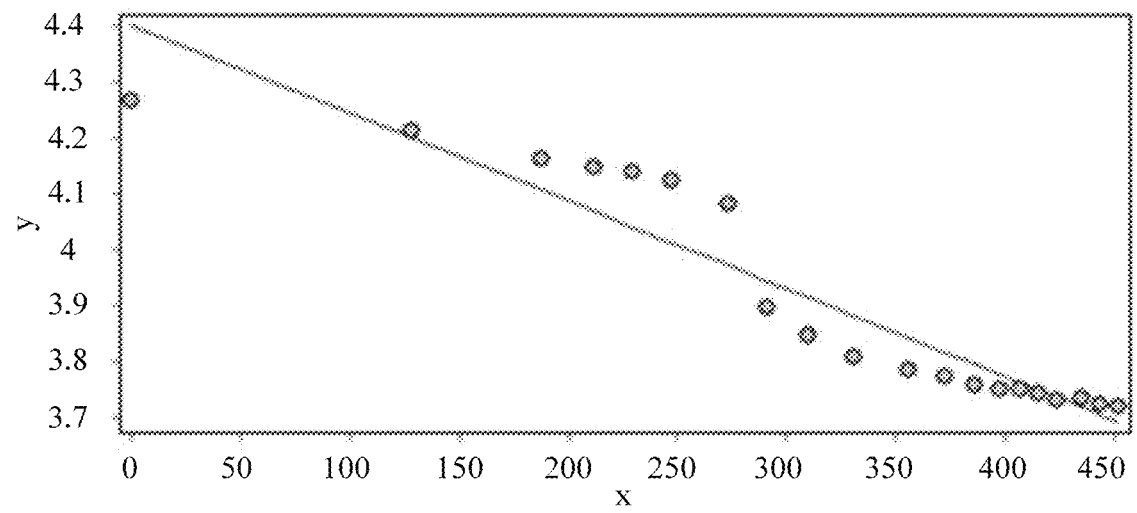
FIG. 9B is a schematic diagram of an I-V curve when a module in a cell string is blocked by a shadow.
Figure 9C:
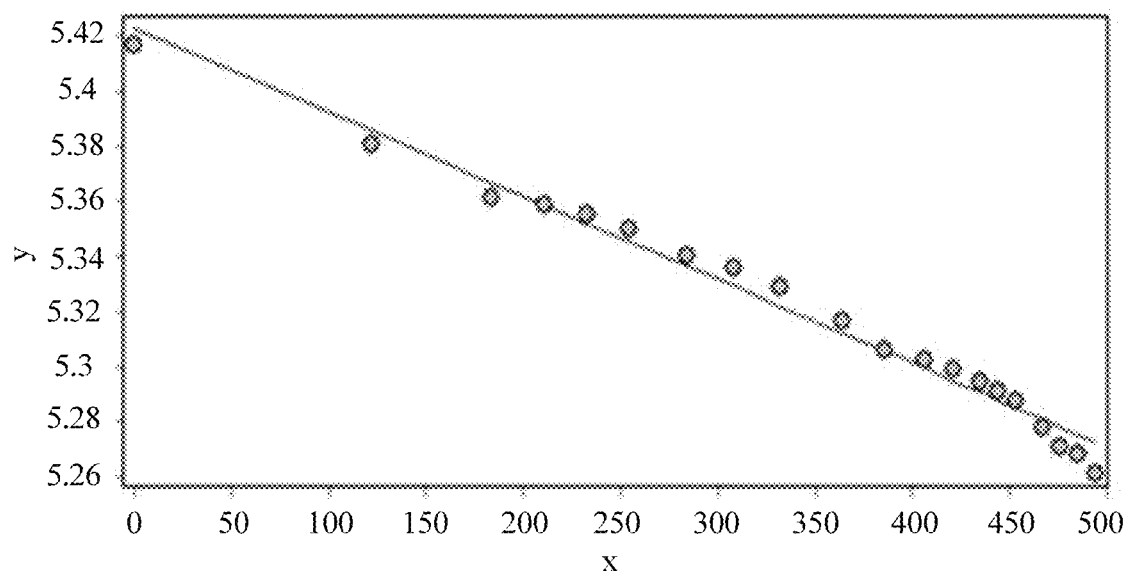
FIG. 9C is a schematic diagram of an I-V curve when a cell in a cell string has no output.

FIG. 9A is a schematic diagram of an I-V curve when there is no faulty module in a cell string. FIG. 9B is a schematic diagram of an I-V curve when a module in a cell string is blocked by a shadow. FIG. 9C is a schematic diagram of an I-V curve when a cell in a cell string has no output. When a fault occurs in a module in the cell string, a shape of the I-V curve of the cell string is deformed in different parts according to a fault type. For example, FIG. 9A to FIG. 9C sequentially show the I-V curve when there is no faulty module in the cell string, the I-V curve when a module in the cell string is blocked by a shadow, and the I-V curve when a cell in the cell string has no output. According to an I-V curve obtained by means of scanning, a "single-diode model" is used as an example, and the following formula is used:

$$I = I_L - I_0\left\{\exp\left[\frac{q(V + IR_S)}{nkT}\right] - 1\right\} - \frac{V + IR_S}{R_{sh}},$$

Fitting processing is performed on I-V data of a cell string under test in a scenario shown in the following Table 1, to obtain curve-related standard characteristic parameters (including a standard characteristic parameter 1 and a standard characteristic parameter 2) in different fault cases.

TABLE 1

| Number | Scenario |
|---|---|
| 1 | Test without blocking |
| 2 | Human shadow blocking |
| 3 | One cell is blocked |
| 4 | Multiple cells are blocked |
| 5 | PID degradation occurs in a module |
| 6 | Current mismatch exists in a module |
| 7 | A hot spot exists in a module |
| 8 | A diode inside a module is short-circuited |
| 9 | A glass panel of a module is broken |

Figure 10A:
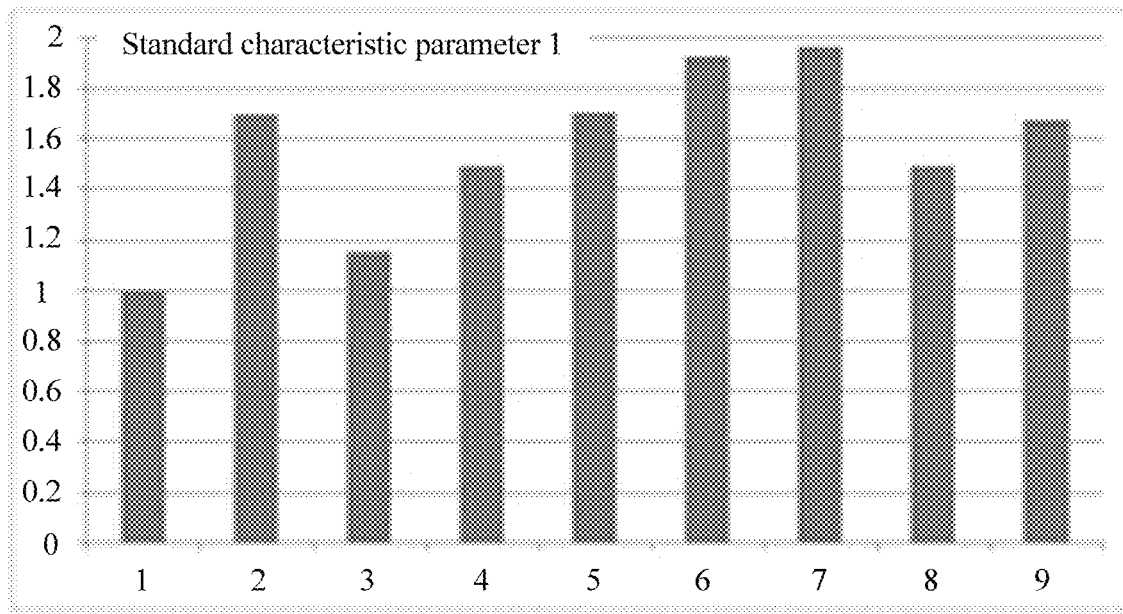
FIG. 10A is a schematic diagram of standard characteristic parameters 1 of a cell string in different fault cases.
Figure 10B:
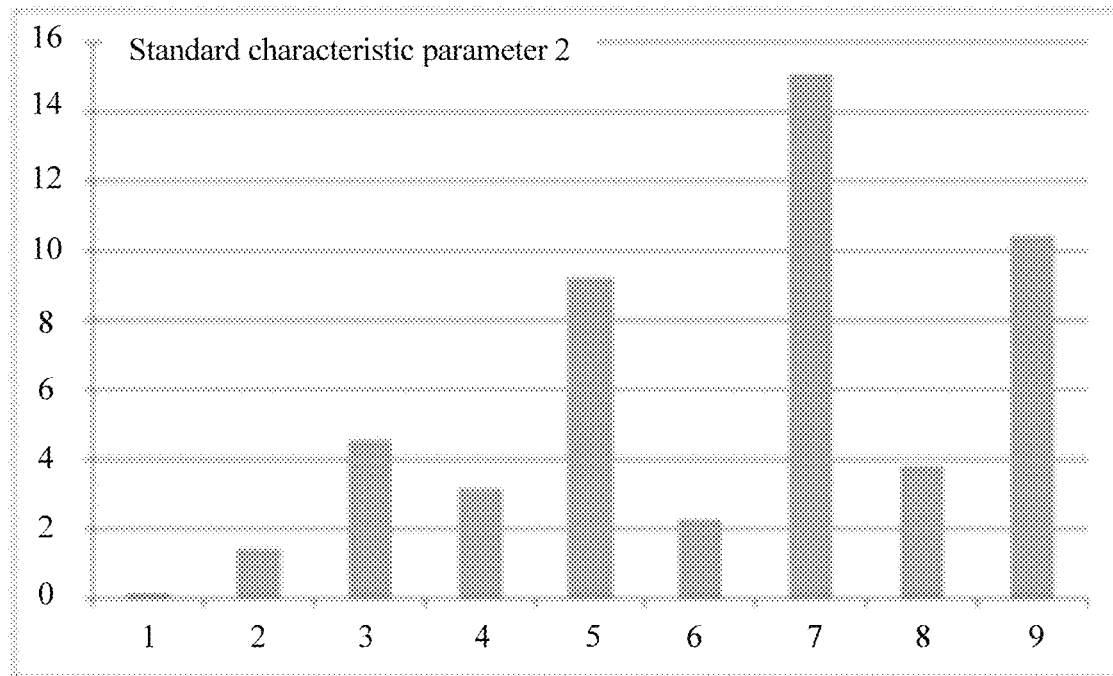
FIG. 10B is a schematic diagram of standard characteristic parameters 2 of a cell string in different fault cases.

FIG. 10A is a schematic diagram of standard characteristic parameters 1 of a cell string in different fault cases. FIG. 10B is a schematic diagram of standard characteristic parameters 2 of a cell string in different fault cases. As shown in FIG. 10A and FIG. 10B, it can be found that all standard characteristic parameters obtained by fitting I-V values of the cell string in different fault types of the cell string are different. Accordingly, actually measured data of each cell string may be fitted in the foregoing manner and compared with an obtained standard characteristic parameter in order to identify different faults of the cell string.

Figure 11A:
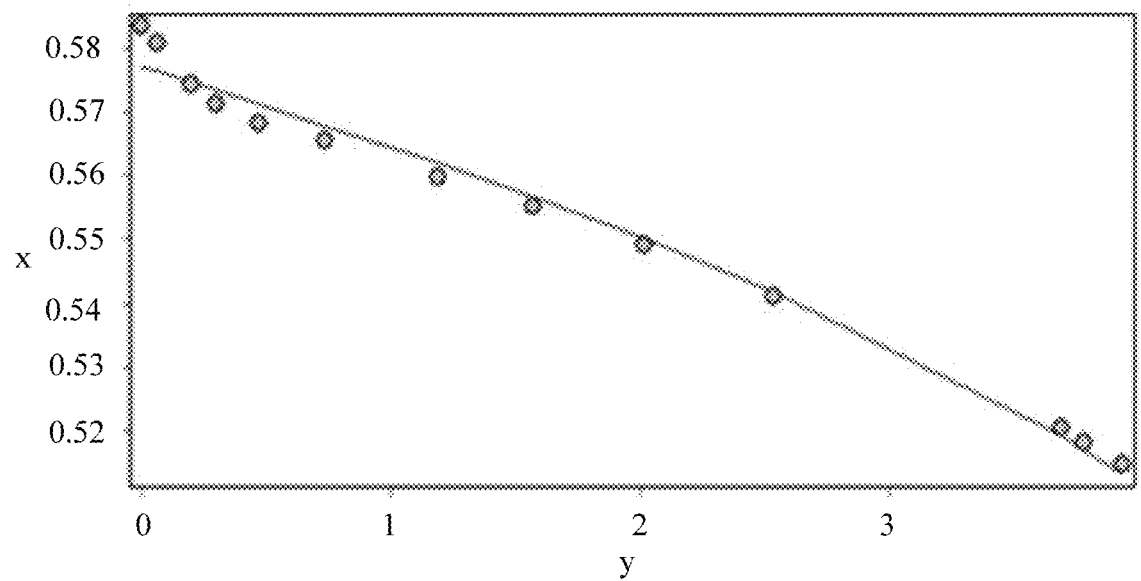
FIG. 11A is a schematic diagram of an I-V curve when there is no faulty module in a cell string.
Figure 11B:
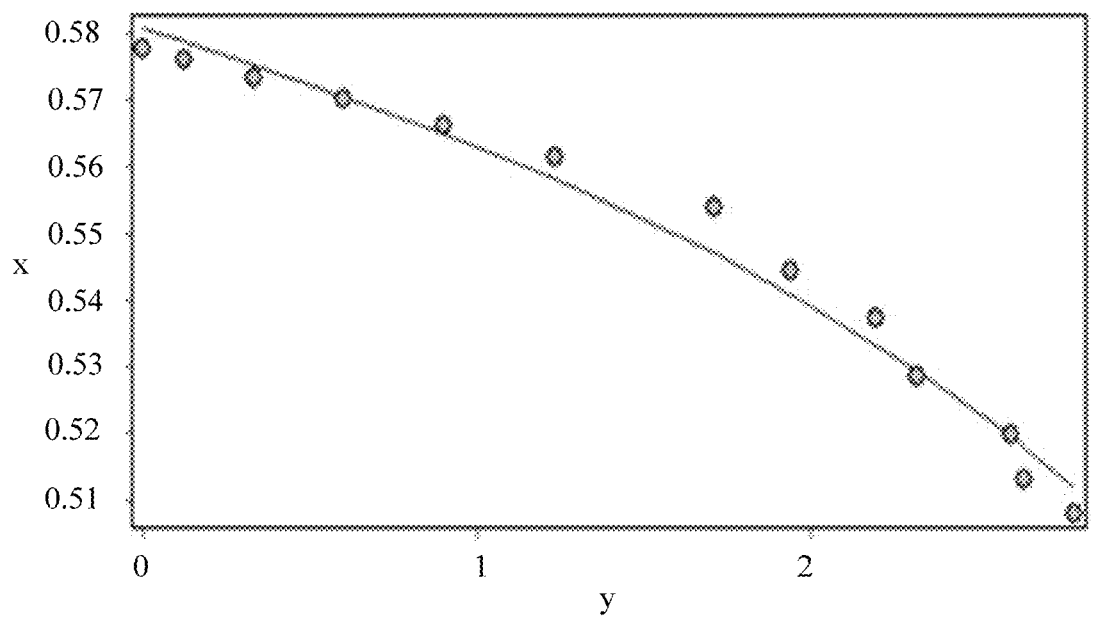
FIG. 11B is a schematic diagram of an I-V curve when current mismatch exists in a module in a cell string.
Figure 11C:
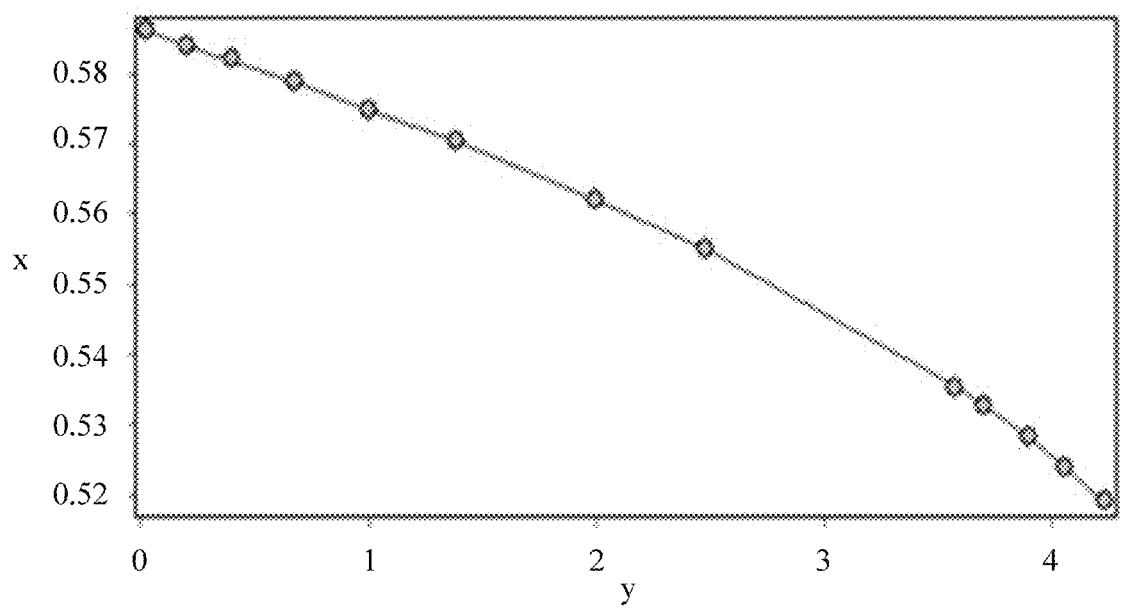
FIG. 11C is a schematic diagram of an I-V curve when PID degradation exists in a module in a cell string.

FIG. 11A is a schematic diagram of an I-V curve when there is no faulty module in a cell string. FIG. 11B is a schematic diagram of an I-V curve when current mismatch exists in a module in a cell string. FIG. 11C is a schematic diagram of an I-V curve when PID exists in a module in a cell string. When a fault occurs in a module in the cell string, a shape of the I-V curve of the cell string is deformed in different parts according to a fault type. FIG. 11A to FIG. 11C sequentially show the I-V curve when there is no faulty module in the cell string, the I-V curve when current mismatch exists in a module in the cell string, and the I-V curve when PID exists in the cell string.

According to the foregoing I-V curve, a "half-physical and half-mathematical" model is used as an example, and the following formula is used:

$$I = -\frac{1}{R_{sh}}V + I_{sc}.$$

Figure 12:
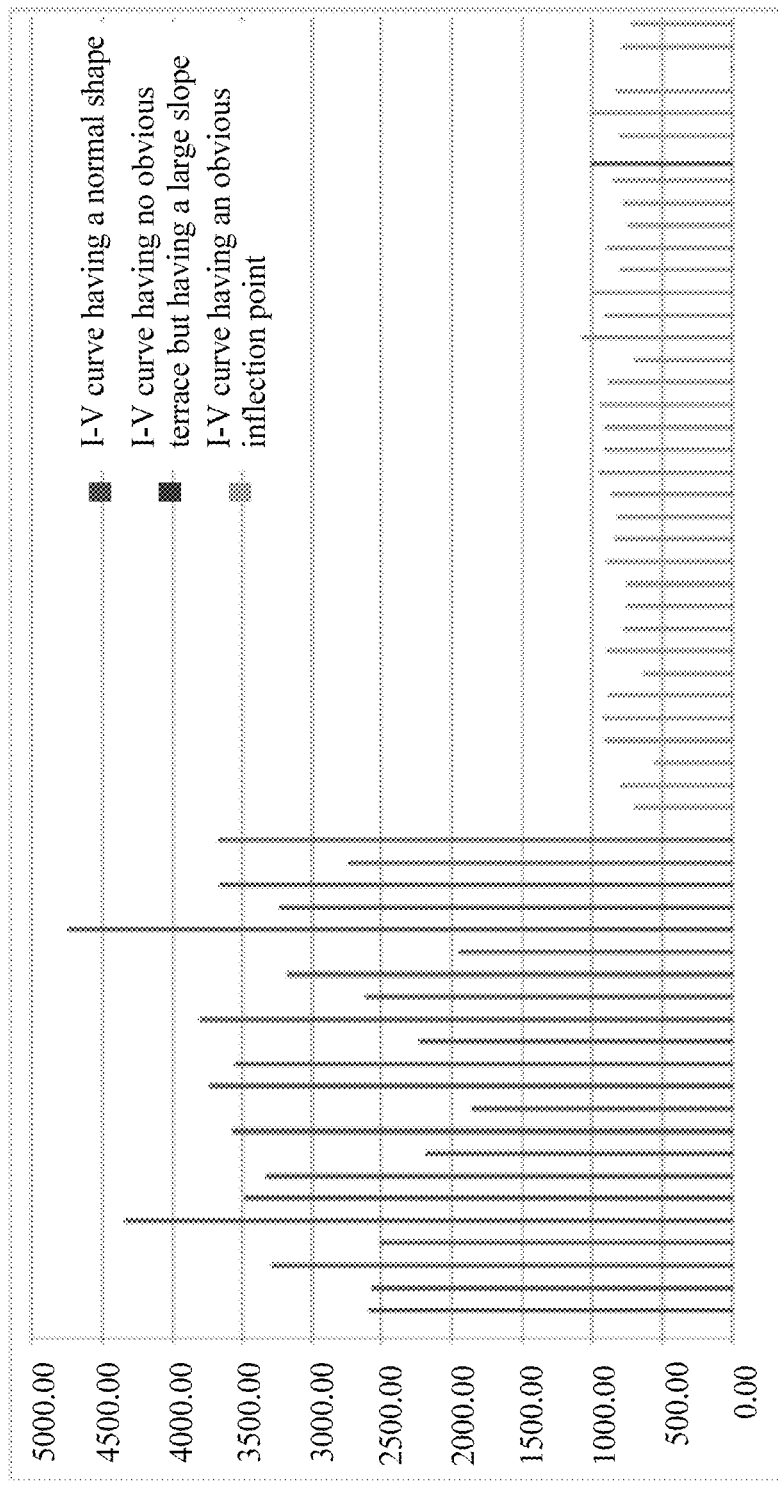
FIG. 12 is a schematic diagram of comparison between characteristic parameters of a cell string in three fault cases: no faulty module exists; current mismatch exists in a module; and PID exists.

Fitting is performed on I-V data of a cell string under test in a scenario shown in the foregoing Table 1, to obtain characteristic parameters of a curve in different fault cases. The obtained characteristic parameters are drawn in an image for comparison. FIG. 12 is a schematic diagram of comparison between characteristic parameters of a cell string in three fault cases there is no faulty module, current mismatch exists in a module, and PID exists. As shown in FIG. 12, it can be found that in different fault types, characteristic parameters Rsh obtained by fitting the I-V data of the cell string are different, and different faults of the cell string are identified using different combinations of characteristic parameters.

In a specific implementation, fitting processing may be performed, using any model, on multiple groups of I-V values of a cell string that are obtained by means of scanning, to obtain an actually measured characteristic parameter of the cell string, and then the actual characteristic parameter is compared with a pre-obtained standard characteristic parameter to determine a fault of the cell string. In any one of the foregoing manners, after a faulty string is identified, EL imaging may be obtained by means of remote drone infrared imaging or by applying a reverse voltage onto the faulty string, where the reverse voltage may be applied using an external power supply or an inverter. Therefore, a specific faulty module is identified.

Figure 13:
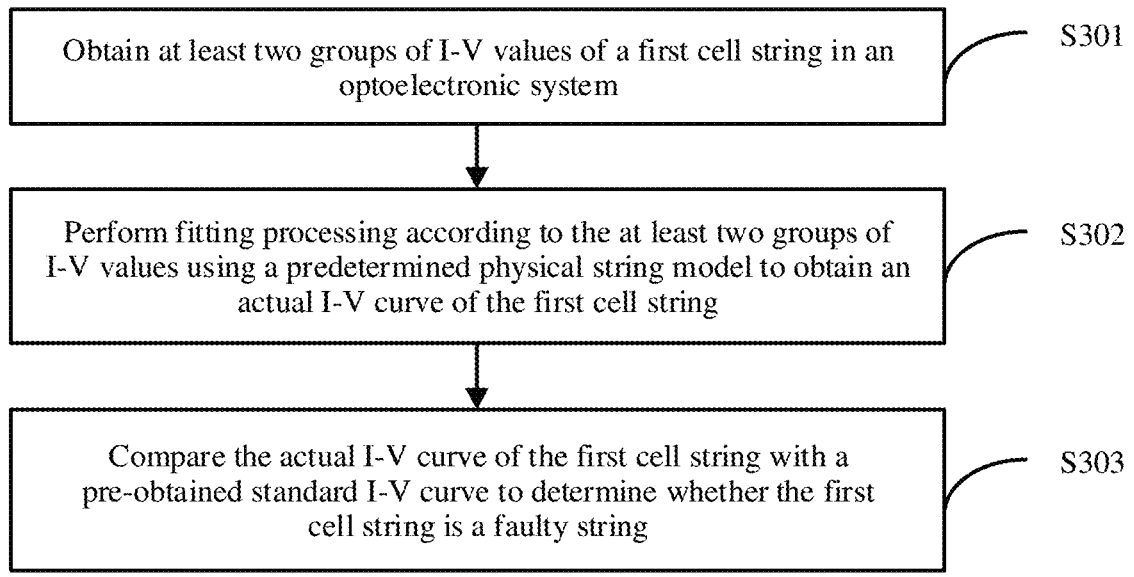
FIG. 13 is a flowchart of Embodiment 3 of a method for identifying a cell string fault in an optoelectronic system according to this application.

FIG. 13 is a flowchart of Embodiment 3 of a method for identifying a cell string fault in an optoelectronic system according to this application. As shown in FIG. 13, a specific implementation of the method for identifying a cell string fault in an optoelectronic system in this embodiment includes the following steps.

Step S301. Obtain at least two groups of I-V values of a first cell string in the optoelectronic system.

A manner of obtaining I-V values of each cell string is similar to that in the foregoing two embodiments.

Step S302. Perform fitting processing according to the at least two groups of I-V values using a predetermined physical string model to obtain an actual I-V curve of the first cell string.

In this solution, the physical string model is used to indicate a relationship between a current and a voltage that are outputted by the first cell. The physical string model that may be used is the same as that used in Embodiment 1 and Embodiment 2. Fitting may be performed using any one of a forward output standard double-diode model, a reverse input standard double-diode model, a forward output single-diode model, a reverse input single-diode model, or a half-mathematical and half-physical segment fitting model, to obtain the I-V curve of the first cell string.

Step S303. Compare the actual I-V curve of the first cell string with a pre-obtained standard I-V curve to determine whether the first cell string is a faulty string.

The standard I-V curve is a curve obtained by means of fitting according to I-V values outputted by the first cell string in a normal operating state and using the physical string model.

In this step, an actually tested I-V curve of the first cell string may be obtained by means of fitting using a selected physical string model and according to the obtained I-V values, and then be compared with the pre-obtained standard I-V curve. If the I-V curve of the first cell string is the same as the standard I-V curve, it is considered that the first cell string is not faulty. If the I-V curve of the first cell string is not the same as the standard I-V curve, it is considered that the first cell string is faulty.

In a specific implementation, a manner of obtaining a standard I-V curve is performing fitting processing according to the I-V values of the first cell string and an ambient temperature and using the predetermined physical string model and a normal characteristic parameter to obtain the standard I-V curve of the first cell string. A relatively simple processing manner is performing fitting processing by substituting a short-circuit current and an open-circuit voltage that are in I-V data of the first cell string into a selected physical model to obtain the standard I-V curve of the first cell string. Alternatively, the standard I-V curve may be obtained by means of fitting by directly determining normal I-V values of the first cell string. A specific implementation is not limited in the solutions.

During comparison between an actually measured I-V curve of the first cell string and a standard I-V curve, a difference between the actual I-V curve and the standard I-V curve needs to be calculated. If the difference is greater than a preset difference threshold, it is determined that the first cell string is a faulty string. If the difference is less than or equal to a preset difference threshold, it is determined that the first cell string is not faulty. The difference threshold herein may be set according to actual experimental data.

In the foregoing process of comparison between the standard I-V curve and the actual I-V curve, a difference between the standard I-V curve and an actual I-V curve obtained by means of fitting (referred to as an actual I-V curve below) may be calculated. Whether a faulty module is included in an actual cell string is determined according to a value of the difference. An example of a method for calculating a difference is one group of I-V points is separately selected from a normal I-V curve and an actual I-V curve. The two groups of I-V points are the same in one dimension (that is, when currents are the same, a difference between voltages corresponding to the currents on the two curves is calculated, or when voltages are the same, a difference between currents corresponding to the voltages on the two curves is calculated). A quadratic sum of differences between points is calculated and used as the difference. When the quadratic sum is relatively large, it indicates that a contact ratio of two curves is relatively low and there is an abnormal module in a cell string corresponding to the actual I-V curve.

Figure 14:
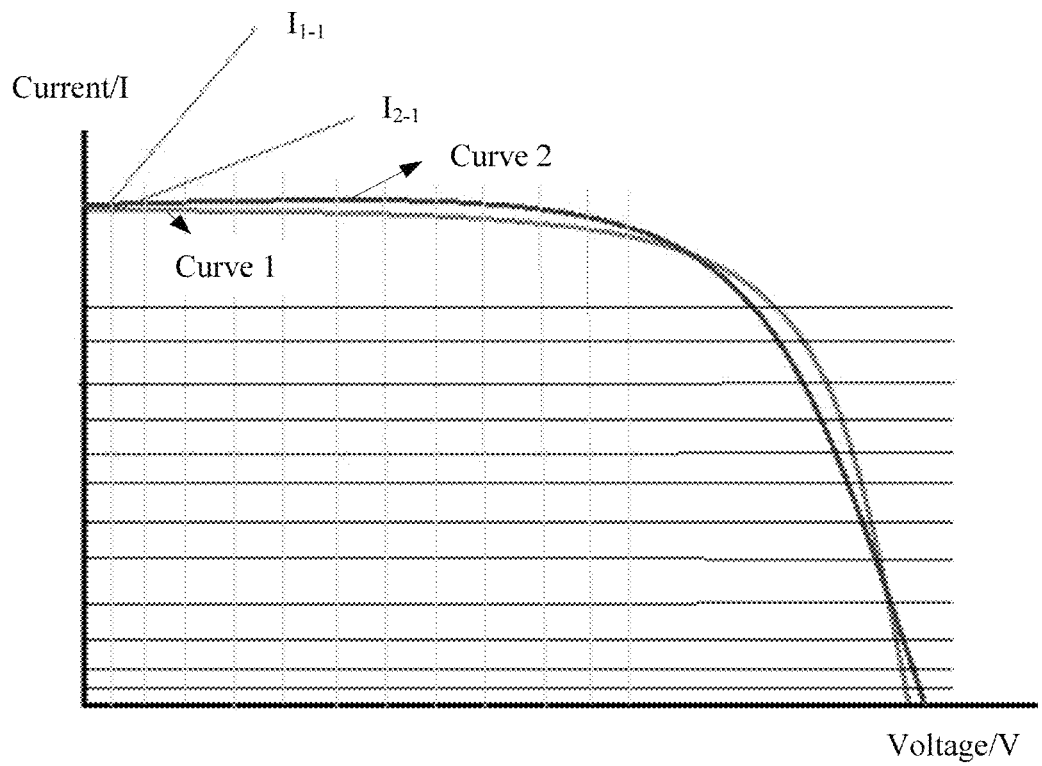
FIG. 14 is a schematic diagram of comparison between a standard I-V curve of a string and an actual I-V curve of the string.

The following describes in detail a specific curve comparison manner. Comparison is required after a standard I-V curve is obtained according to any one of the foregoing models and an actual I-V curve is obtained by means of fitting according to actually measured data of a cell string in an example and using the model. FIG. 14 is a schematic diagram of comparison between a standard I-V curve of a cell string and an actual I-V curve of the cell string. As shown in FIG. 14, a curve 1 is an I-V output curve of a normal cell string, that is, a standard I-V curve, and may be obtained by means of fitting using a physical model, an output I-V parameter of a current cell string, a normal cell string characteristic parameter, an environment parameter, and the like, and a curve 2 is an actual output I-V curve of the cell string, that is, an actual I-V curve, and is obtained using a physical model, fitting of an output I-V point parameter of a current cell string, an environment parameter, and the like.

Two groups of current data are respectively obtained, according to different voltages, from parts of the curves on which voltages are less than 0.8 time of a maximum voltage of the curves, and are recorded as $(I_{101}, I_{1-2} \ldots)$ and $(I_{2-1}, I_{2-1} \ldots)$ Two groups of voltage data are respectively obtained, according to different currents, from parts of the curves on which voltages are greater than 0.8 time of the maximum voltage of the curves, and are recorded as $(V_{1-1}, V_{1-2} \ldots)$ and $(V_{2-1}, V_{2-1} \ldots)$.

Quadratic sums of differences of the two curves are separately calculated:

$$\Sigma \triangle I^2 = (I_{1-1}-I_{2-1})^2 + (I_{1-2}-I_{2-2})^2 + \ldots ; \text{ and}$$

$$\Sigma \triangle V^2 = (V_{1-1}-V_{2-1})^2 + (V_{1-2}-V_{2-2})^2 + \ldots$$

If $\Sigma \triangle I^2$ or $\Sigma \triangle V^2$ is relatively large, it indicates that a contact ratio of the two I-V curves is low, and it is prompted that there is an abnormal module in the cell string, that is, the cell string is a faulty string. If $\Sigma \triangle I^2$ or $\Sigma \triangle V^2$ is less than a preset value or is zero, it is prompted that there is no abnormal module in the cell string, that is, the cell string is not faulty.

Only one I-V curve difference comparison manner is described above, and a curve difference may also be evaluated in another similar manner, to determine whether an output I-V characteristic of a cell string is normal.

According to the method for identifying a cell string fault in an optoelectronic system provided in this embodiment, at least two groups of I-V values of a first cell string in the optoelectronic system are obtained, fitting processing is performed according to obtained data using a predetermined physical string model, to obtain a fitted I-V curve corresponding to the first cell string, and then the I-V curve is compared with a pre-obtained standard I-V curve of the first cell string to determine whether the cell string is a faulty string, and by analogy, each cell string in the optoelectronic system is detected in this manner, that is, curve fitting processing is performed on collected data using the physical string model. This solution may be widely applied to a large power station. When a characteristic parameter, which is obtained after all actually measured data of a cell string is comprehensively processed, is compared with a standard characteristic parameter used when there is no fault, a test error at a specific point does not cause erroneous determining, and determining is not dependent on an environment. Therefore, this solution is not affected by inconsistency of environments, and processing efficiency and accuracy of cell string fault identification are effectively improved.

Figure 15:
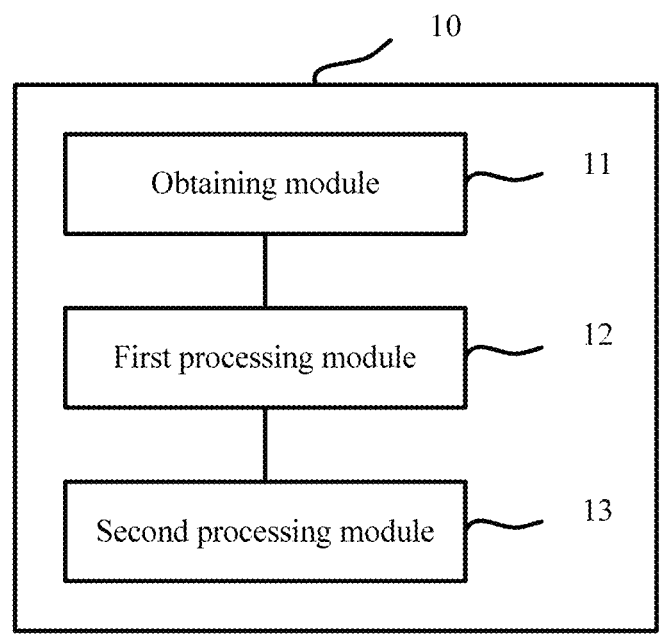
FIG. 15 is a schematic structural diagram of Embodiment 1 of an apparatus for identifying a cell string fault in an optoelectronic system according to this application.

FIG. 15 is a schematic structural diagram of Embodiment 1 of an apparatus for identifying a cell string fault in an optoelectronic system according to this application. As shown in FIG. 15, an apparatus 10 for identifying a cell string fault in an optoelectronic system includes an obtaining module 11 configured to obtain at least two groups of current-voltage I-V values of a first cell string in the optoelectronic system, a first processing module 12 configured to perform fitting processing according to the at least two groups of I-V values and using a predetermined physical string model to obtain at least one characteristic parameter of the first cell string, where the physical string model is used to indicate a relationship between the I-V values of the first cell string and the characteristic parameter of the first cell string, and the characteristic parameter is a constant that is in the physical string model and that is used to indicate a relationship between a current and a voltage that are outputted by the cell string, and a second processing module 13 configured to separately compare the at least one characteristic parameter of the first cell string with a standard characteristic parameter corresponding to each characteristic parameter to determine whether the first cell string in the optoelectronic system is a faulty string, where the standard characteristic parameter of the first cell string is a pre-obtained standard value used for comparison with the characteristic parameter of the first cell string.

The apparatus for identifying a cell string fault in an optoelectronic system provided in this embodiment is configured to perform the technical solutions of method embodiments shown in FIG. 1 to FIG. 14, and implementation principles and technical effects of the apparatus are similar. Curve fitting processing is performed on collected data using a physical string model. This solution may be widely applied to a large power station. When a characteristic parameter, which is obtained after all actually measured data of a cell string is comprehensively processed, is compared with a standard characteristic parameter used when there is no fault, a test error at a specific point does not cause erroneous determining, and determining is not dependent on an environment. Therefore, this solution is not affected by an environment change, and processing efficiency and accuracy of cell string fault identification are effectively improved.

Figure 16:
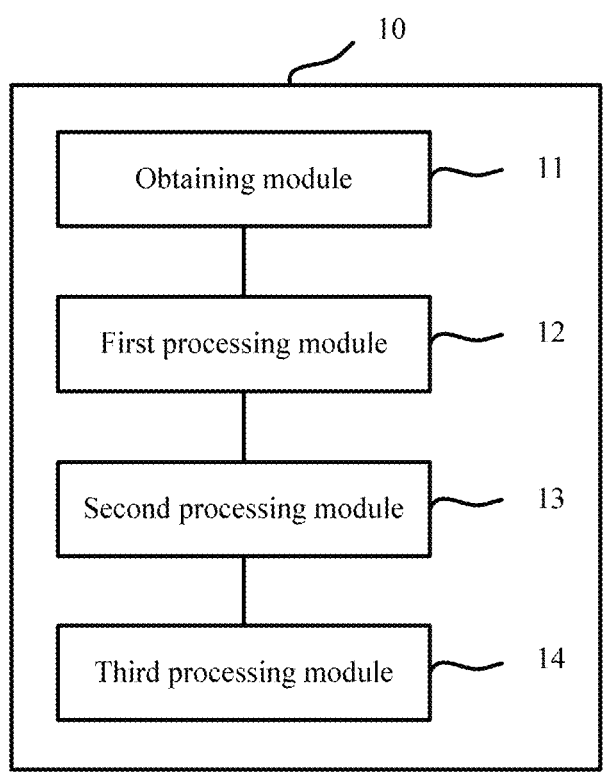
FIG. 16 is a schematic structural diagram of Embodiment 2 of an apparatus for identifying a cell string fault in an optoelectronic system according to this application.

FIG. 16 is a schematic structural diagram of Embodiment 2 of an apparatus 10 for identifying a cell string fault in an optoelectronic system according to this application. As shown in FIG. 16, based on the foregoing embodiment, the apparatus 10 for identifying a cell string fault in an optoelectronic system further includes a third processing module 14 configured to determine at least one faulty module from the faulty string.

Further, the third processing module 14 is further configured to determine a faulty module from the faulty string by means of infrared thermal near-end imaging or infrared thermal remote imaging, or determine a faulty module from the faulty string by means of EL near-end imaging or EL remote imaging, or determine a faulty module from the faulty string by means of optical near-end imaging or optical remote imaging.

Optionally, the third processing module 14 is further configured to apply a voltage onto the faulty string using an inverter such that the faulty string enters an EL state, and then determine the faulty module in the faulty string by means of near-end imaging or remote imaging.

Optionally, the obtaining module 11 is further configured to apply a voltage onto the cell string using the inverter, to obtain reversely inputted cell string I-V values.

The apparatus for identifying a cell string fault in an optoelectronic system provided in this embodiment is configured to perform the technical solutions of method embodiments shown in FIG. 1 to FIG. 14. Implementation principles and technical effects of the apparatus are similar, and details are not described herein again.

Based on the foregoing embodiment, if the standard characteristic parameter includes the second standard characteristic parameter of the string in each fault case, the second processing module 13 is further configured to determine a fault type of the faulty string according to the at least one characteristic parameter of the first cell string and the second standard characteristic parameter of the first cell string in each fault case.

Optionally, the fault type of the cell string determined by the second processing module 13 includes at least one of the following types output power of a module in the cell string is abnormally degraded, PID occurs in a module in the cell string, a cell unit inside a module in the cell string fails, current mismatch exists in a module in the cell string, a hot spot appears in a module in the cell string, a diode inside a module in the cell string is short-circuited, a glass panel of a module in the cell string is broken, an open circuit exists inside a module in the cell string, or a module in the cell string is blocked.

Optionally, if the physical string model is a half-mathematical and half-physical segment fitting model, the first processing module 12 is further configured to divide a voltage value range of the first cell string into at least two segments, perform, in each segment, fitting processing according to at least one group of I-V values and using a preset simplified physical model, to obtain a characteristic parameter of the first cell string in the segment, and use the characteristic parameter of the first cell string in each segment as the at least one characteristic parameter of the first cell string.

The voltage value range is a range between a short-circuit voltage of the first cell string and any set value that is less than a maximum bearable voltage of the first cell string.

Optionally, the obtaining module 11 is further configured to perform fitting processing using the predetermined physical string model to obtain the first standard characteristic parameter of the first cell string during normal operation and/or the second standard characteristic parameter of the first cell string in each fault case.

The standard characteristic parameter of the first cell string includes the first standard characteristic parameter of the cell string during normal operation and/or the second standard characteristic parameter of the cell string in each fault case.

Optionally, when the characteristic parameter includes the first standard characteristic parameter, the second processing module 13 is further configured to separately compare the at least one characteristic parameter of the first cell string with the first standard characteristic parameter corresponding to each characteristic parameter, where if the at least one characteristic parameter falls in a preset range of the corresponding first standard characteristic parameter, the first cell string is not faulty, or if the at least one characteristic parameter does not fall in a preset range of the corresponding first standard characteristic parameter, the first cell string is a faulty string.

Optionally, when the characteristic parameter includes the second standard characteristic parameter of the first cell string in each fault case, the second processing module 13 is further configured to separately compare the at least one characteristic parameter of the first cell string with the second standard characteristic parameter of the first cell string in each fault case.

If the at least one characteristic parameter of the first cell string falls in a preset range of a second standard characteristic parameter, the first cell string is a faulty string, and a fault type of the first cell string is a fault type corresponding to the second standard characteristic parameter.

The apparatus for identifying a cell string fault in an optoelectronic system provided in this embodiment is configured to perform the technical solutions of method embodiments shown in FIG. 1 to FIG. 14. Implementation principles and technical effects of the apparatus are similar, and details are not described herein again.

Figure 17:
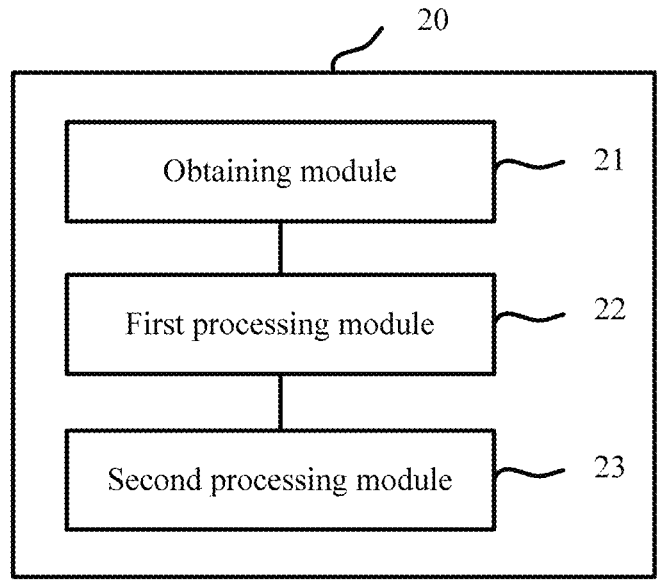
FIG. 17 is a schematic structural diagram of Embodiment 3 of an apparatus for identifying a cell string fault in an optoelectronic system according to this application.

FIG. 17 is a schematic structural diagram of Embodiment 3 of an apparatus 20 for identifying a cell string fault in an optoelectronic system according to this application. As shown in FIG. 17, the apparatus 20 for identifying a cell string fault in an optoelectronic system includes an obtaining module 21 configured to obtain at least two groups of current-voltage I-V values of a first cell string in the optoelectronic system, a first processing module 22 configured to perform fitting processing according to the at least two groups of I-V values and using a predetermined physical string model to obtain an actual I-V curve of the first cell string, where the physical string model is used to indicate a relationship between a current and a voltage that are outputted by the first cell, and a second processing module 23 configured to compare the actual I-V curve of the first cell string with a pre-obtained standard I-V curve to determine whether the first cell string is a faulty string, where the standard I-V curve is a curve obtained by means of fitting according to I-V values outputted by the first cell string in a normal operating state and using the physical string model.

The apparatus for identifying a cell string fault in an optoelectronic system provided in this embodiment is configured to perform the technical solutions of method embodiments shown in FIG. 1 to FIG. 14. Implementation principles and technical effects of the apparatus are similar, and details are not described herein again.

Figure 18:
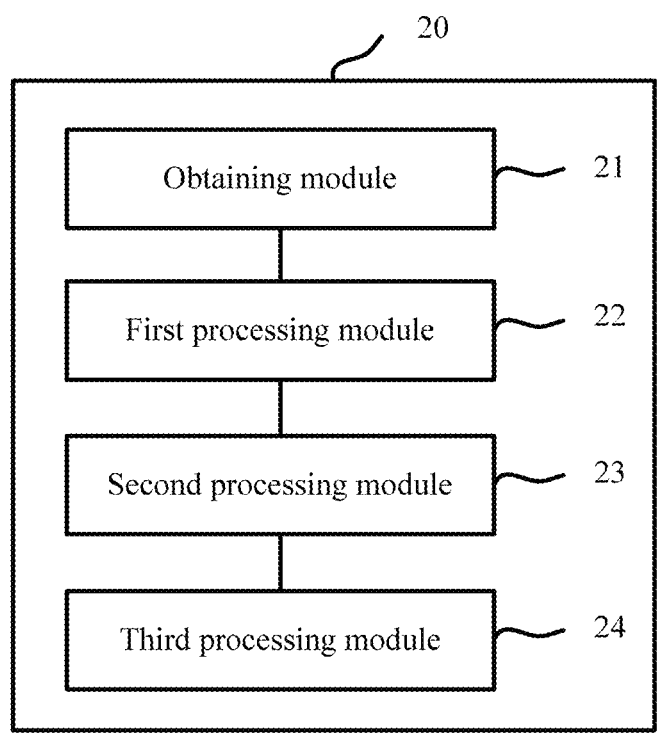
FIG. 18 is a schematic structural diagram of Embodiment 4 of an apparatus for identifying a cell string fault in an optoelectronic system according to this application.

FIG. 18 is a schematic structural diagram of Embodiment 4 of an apparatus 20 for identifying a cell string fault in an optoelectronic system according to this application. As shown in FIG. 18, based on the foregoing embodiment, the apparatus 20 for identifying a cell string fault in an optoelectronic system further includes a third processing module 24 configured to determine at least one faulty module from the faulty string.

Based on the foregoing embodiment, the obtaining module 21 is further configured to perform fitting processing according to the I-V values of the first cell string and using the predetermined physical string model and a first standard characteristic parameter that is used during normal operation, to obtain the standard I-V curve of the first cell string.

Figure 19:
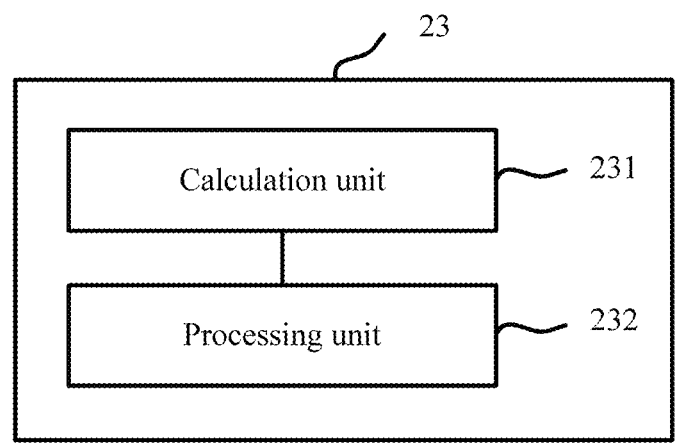
FIG. 19 is a schematic structural diagram of Embodiment 5 of a second processing module according to this application.

FIG. 19 is a schematic structural diagram of Embodiment 5 of a second processing module 23 according to this application. As shown in FIG. 19, based on the foregoing embodiments, the second processing module 23 includes a calculation unit 231 configured to calculate a difference between the actual I-V curve and the standard I-V curve, and a processing unit 232 configured to, if the difference is greater than a preset difference threshold, determine that the first cell string is a faulty string.

The apparatus for identifying a cell string fault in an optoelectronic system provided in this embodiment is configured to perform the technical solutions of method embodiments shown in FIG. 1 to FIG. 14. Implementation principles and technical effects of the apparatus are similar, and details are not described herein again.

Figure 20:
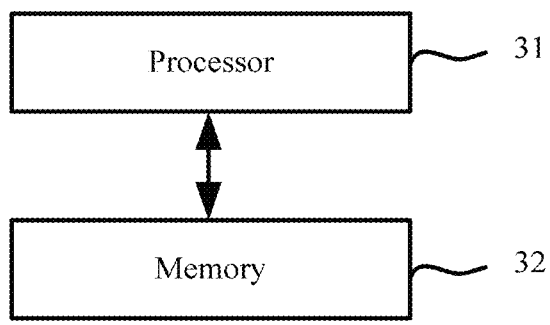
FIG. 20 is a schematic structural diagram of Embodiment 1 of a device for identifying a cell string fault in an optoelectronic system according to this application.

FIG. 20 is a schematic structural diagram of Embodiment 1 of a device for identifying a cell string fault in an optoelectronic system according to this application. As shown in FIG. 20, the device for identifying a cell string fault in an optoelectronic system includes a processor 31 configured to control execution of an executable instruction and a memory 32 configured to store the processor executable instruction.

The processor 31 is configured to obtain at least two groups of current-voltage I-V values of a first cell string in the optoelectronic system, perform fitting processing according to the at least two groups of I-V values and using a predetermined physical string model to obtain at least one characteristic parameter of the first cell string, where the physical string model is used to indicate a relationship between the I-V values of the first cell string and the characteristic parameter of the first cell string, and the characteristic parameter is a constant that is in the physical string model and that is used to indicate a relationship between a current and a voltage that are outputted by the cell string, and separately compare the at least one characteristic parameter of the first cell string with a standard characteristic parameter corresponding to each characteristic parameter to determine whether the first cell string in the optoelectronic system is a faulty string, where the standard characteristic parameter of the first cell string is a pre-obtained standard value used for comparison with the characteristic parameter of the first cell string.

Optionally, if the physical string model is a half-mathematical and half-physical segment fitting model, the processor 31 is further configured to divide a voltage value range of the first cell string into at least two segments, perform, in each segment, fitting processing according to at least one group of I-V values and using a preset simplified physical model to obtain a characteristic parameter of the first cell string in the segment, and use the characteristic parameter of the first cell string in each segment as the at least one characteristic parameter of the first cell string.

The voltage value range is a range between a short-circuit voltage of the first cell string and any set value that is less than a maximum bearable voltage of the first cell string.

Optionally, the standard characteristic parameter that is of the first cell string and that is obtained by the processor 31 includes a first standard characteristic parameter of the first cell string during normal operation and/or a second standard characteristic parameter of the first cell string in each fault case.

Optionally, when the characteristic parameter includes the first standard characteristic parameter, the processor 31 is further configured to separately compare the at least one characteristic parameter of the first cell string with the first standard characteristic parameter corresponding to each characteristic parameter, where if the at least one characteristic parameter falls in a preset range of the corresponding first standard characteristic parameter, the first cell string is not faulty, or if the at least one characteristic parameter does not fall in a preset range of the corresponding first standard characteristic parameter, the first cell string is a faulty string.

Optionally, when the characteristic parameter includes the second standard characteristic parameter of the first cell string in each fault case, the processor 31 is further configured to separately compare the at least one characteristic parameter of the first cell string with the second standard characteristic parameter of the first cell string in each fault case.

If the at least one characteristic parameter of the first cell string falls in a preset range of a second standard characteristic parameter, the first cell string is a faulty string, and a fault type of the first cell string is a fault type corresponding to the second standard characteristic parameter.

Optionally, the processor 31 is further configured to determine at least one faulty module from the faulty string.

Optionally, the processor 31 is further configured to determine a faulty module from the faulty string by means of infrared thermal near-end imaging or infrared thermal remote imaging, or determine a faulty module from the faulty string by means of EL near-end imaging or EL remote imaging, or determine a faulty module from the faulty string by means of optical near-end imaging or optical remote imaging.

Optionally, the processor 31 is further configured to control an inverter to apply a voltage onto the faulty string such that the faulty string enters an EL state, and then determine the faulty module in the faulty string by means of near-end imaging or remote imaging.

Optionally, the processor 31 is further configured to apply a voltage onto the first cell string using the inverter, to obtain reversely inputted string I-V values.

Optionally, the fault type that is of the first cell string and that is obtained by the processor 31 includes at least one of the following types output power of a module in the first cell string is abnormally degraded, PID degradation occurs in a module in the first cell string, a cell unit inside a module in the first cell string fails, current mismatch exists in a module in the first cell string, a hot spot appears in a module in the first cell string, a diode inside a module in the first cell string is short-circuited, a glass panel of a module in the first cell string is broken, an open circuit exists inside a module in the first cell string, or a module in the first cell string is blocked.

Optionally, the processor 31 is further configured to perform fitting processing using the predetermined physical string model to obtain the first standard characteristic parameter of the first cell string during normal operation and/or the second standard characteristic parameter of the first cell string in each fault case.

Figure 21:
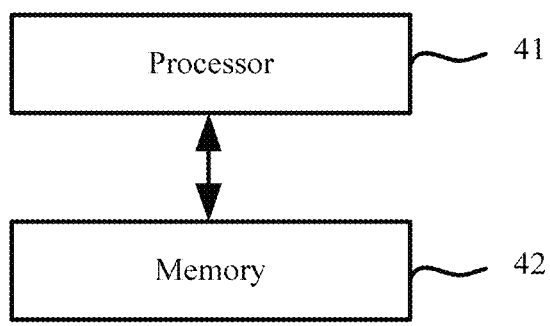
FIG. 21 is a schematic structural diagram of Embodiment 2 of a device for identifying a cell string fault in an optoelectronic system according to this application.

FIG. 21 is a schematic structural diagram of Embodiment 2 of a device for identifying a cell string fault in an optoelectronic system according to this application. As shown in FIG. 21, the device for identifying a cell string fault in an optoelectronic system includes a processor 41 configured to control execution of an executable instruction and a memory 42 configured to store the processor executable instruction.

The processor 41 is configured to obtain at least two groups of current-voltage I-V values of a first cell string in the optoelectronic system, perform fitting processing according to the at least two groups of I-V values and using a predetermined physical string model, to obtain an actual I-V curve of the first cell string, where the physical string model is used to indicate a relationship between a current and a voltage that are outputted by the first cell, and compare the actual I-V curve of the first cell string with a pre-obtained standard I-V curve to determine whether the first cell string is a faulty string, where the standard I-V curve is a curve obtained by means of fitting according to I-V values outputted by the first cell string in a normal operating state and using the physical string model.

Optionally, the processor 41 is further configured to determine at least one faulty module from the faulty string.

Optionally, the processor 41 is further configured to perform fitting processing according to the I-V values of the first cell string and using the predetermined physical string model and a standard characteristic parameter that is used during normal operation, to obtain the standard I-V curve of the first cell string.

Optionally, the processor 41 is further configured to calculate a difference between the actual I-V curve and the standard I-V curve, and if the difference is greater than a preset difference threshold, determine that the first cell string is a faulty string.

The device for identifying a cell string fault in an optoelectronic system provided in the foregoing two embodiments is configured to perform the technical solutions of method embodiments shown in FIG. 1 to FIG. 14. Implementation principles and technical effects of the device are similar, and details are not described herein again.

In the foregoing embodiments of the device for identifying a cell string fault in an optoelectronic system, it should be understood that the processor may be a central processing unit (CPU), or may be another general-purpose processor, a digital signal processor (DSP), an application-specific integrated circuit (ASIC), or the like. The general-purpose processor may be a microprocessor, or the processor may be any conventional processor, or the like. The steps of the method disclosed with reference to the embodiments of this application may be directly performed by a hardware processor, or may be performed using a combination of hardware in the processor and a software module.

A person of ordinary skill in the art may understand that all or some of the steps of the method embodiments may be implemented by a program instructing relevant hardware. The foregoing program may be stored in a computer-readable memory. When the program is executed, the steps of the methods in the embodiments are performed. The foregoing memory (storage medium) includes a read-only memory (ROM), a random access memory (RAM), a flash memory, a hard disk, a solid state disk, a magnetic tape, a floppy disk, an optical disc, and any combination thereof.

Finally, it should be noted that the foregoing embodiments are merely intended for describing the technical solutions of this application, rather than limiting this application.

What is claimed is:

1. A method for identifying a cell string fault in a photovoltaic power generation system, wherein the photovoltaic power generation system comprises a cell string, an inverter coupled to the cell string, and a power station monitor coupled to the inverter through a communication connection, and wherein the method comprises:
   obtaining, by the inverter or the power station monitor, obtaining at least two groups of current-voltage (I-V) values of the cell string;
   performing, by the inverter or the power station monitor, fitting processing according to the at least two groups of the I-V values using a predetermined physical string model to obtain at least one characteristic parameter of the cell string, wherein the predetermined physical string model indicates a relationship between the I-V values of the cell string and the at least one characteristic parameter of the cell string, and wherein the at least one characteristic parameter comprises a constant in the predetermined physical string model indicating a relationship between a current and a voltage outputted by the cell string; and
   separately comparing, by the inverter or the power station monitor, the at least one characteristic parameter of the cell string with a standard characteristic parameter corresponding to each characteristic parameter to determine whether the cell string comprises a faulty string, wherein the standard characteristic parameter of the cell string comprises a pre-obtained standard value used for comparison with the at least one characteristic parameter of the cell string.

2. The method of claim 1, wherein the predetermined physical string model comprises any one of the following models:
   a forward output standard double-diode model;
   a reverse input standard double-diode model;
   a forward output single-diode model;
   a reverse input single-diode model;
   a half-mathematical and half-physical segment fitting model; or
   a pure-mathematical fitting model.

3. The method of claim 2, wherein when the predetermined physical string model comprises the half-mathematical and half-physical segment fitting model, performing the fitting processing comprises:
   dividing a voltage value range of the cell string into at least two segments;
   performing, in each segment, the fitting processing according to at least one group of the I-V values using a preset simplified physical model to obtain a characteristic parameter of the cell string in each segment; and
   setting the characteristic parameter of the cell string in each segment as the at least one characteristic parameter of the cell string, wherein the voltage value range comprises a range from a short-circuit voltage of the cell string to any set value less than a maximum bearable voltage of the cell string.

4. The method of claim 3, wherein the standard characteristic parameter of the cell string comprises a first standard characteristic parameter of the cell string during normal operation or a second standard characteristic parameter of the cell string in each fault case.

5. The method of claim 4, wherein when the standard characteristic parameter comprises the first standard characteristic parameter, separately comparing the at least one characteristic parameter of the cell string with the standard characteristic parameter corresponding to each characteristic parameter comprises separately comparing the at least one characteristic parameter of the cell string with the first standard characteristic parameter corresponding to each characteristic parameter, wherein the cell string does not comprise the faulty string when the at least one characteristic parameter falls in a preset range of the corresponding first standard characteristic parameter, and wherein the cell string comprises the faulty string when the at least one characteristic parameter does not fall in the preset range of the corresponding first standard characteristic parameter.

6. The method of claim 5, wherein when the standard characteristic parameter comprises the second standard characteristic parameter of the cell string in each fault case, separately comparing the at least one characteristic parameter of the cell string with the standard characteristic parameter corresponding to each characteristic parameter comprises separately comparing the at least one characteristic parameter of the cell string with the second standard characteristic parameter of the cell string in each fault case, wherein the cell string comprises the faulty string when the at least one characteristic parameter of the cell string falls in a preset range of the second standard characteristic parameter, and wherein a fault type of the cell string comprises a fault type corresponding to the second standard characteristic parameter.

7. The method of claim 6, further comprising determining at least one faulty circuit from the faulty string.

8. The method of claim 7, wherein determining the at least one faulty circuit from the faulty string comprises:
determining a faulty circuit from the faulty string by infrared thermal near-end imaging or infrared thermal remote imaging;
determining the faulty circuit from the faulty string by electroluminescence (EL) near-end imaging or EL remote imaging; or
determining the faulty circuit from the faulty string by optical near-end imaging or optical remote imaging.

9. The method of claim 8, wherein determining the faulty circuit from the faulty string by the EL near-end imaging or the EL remote imaging comprises:
applying a first voltage onto the faulty string using an inverter coupled to the faulty string to enter the faulty string to an EL state; and
determining the faulty circuit in the faulty string by near-end imaging or remote imaging.

10. The method of claim 9, wherein obtaining the at least two groups of the I-V values of the cell string comprises applying a second voltage onto the cell string using the inverter coupled to the cell string to obtain reversely inputted string I-V values.

11. The method of claim 4, wherein a fault type of the cell string comprises at least one of the following types:
output power of a circuit in the cell string is abnormally degraded;
potential induced degradation (PID) occurs in the circuit in the cell string;
a cell inside the circuit in the cell string fails;
current mismatch exists in the circuit in the cell string;
a hot spot appears in the circuit in the cell string;
a diode inside the circuit in the cell string is short-circuited;
a glass panel of the circuit in the cell string is broken;
an open circuit exists inside the circuit in the cell string; or
the circuit in the cell string is blocked.

12. The method of claim 1, wherein before separately comparing the at least one characteristic parameter of the cell string with the standard characteristic parameter corresponding to each characteristic parameter, the method further comprises performing the fitting processing using the predetermined physical string model to obtain a first standard characteristic parameter of the cell string during normal operation or a second standard characteristic parameter of the cell string in each fault case.

13. A method for identifying a cell string fault in a photovoltaic power generation system, wherein the photovoltaic power generation system comprises a cell string, an inverter coupled to the cell string, and a power station monitor coupled to the inverter through a communication connection, and wherein the method comprises:
obtaining, by the inverter or the power station monitor, at least two groups of current-voltage (I-V) values of the cell string;
performing, by the inverter or the power station monitor, fitting processing according to the at least two groups of the I-V values using a predetermined physical string model to obtain an actual I-V curve of the cell string, wherein the predetermined physical string model indicates a relationship between a current and a voltage outputted by the cell string; and
comparing, by the inverter or the power station monitor, the actual I-V curve of the cell string with a pre-obtained standard I-V curve to determine whether the cell string comprises a faulty string, wherein the pre-obtained standard I-V curve comprises a curve obtained by fitting according to I-V values outputted by the cell string in a normal operating state using the predetermined physical string model.

14. The method of claim 13, further comprising determining at least one faulty circuit from the faulty string.

15. The method of claim 13, wherein before comparing the actual I-V curve of the cell string with the pre-obtained standard I-V curve, the method further comprises performing fitting processing according to the I-V values of the cell string using the predetermined physical string model and a standard characteristic parameter that is used during normal operation to obtain the pre-obtained standard I-V curve of the cell string.

16. The method of claim 15, wherein comparing the actual I-V curve of the cell string with the pre-obtained standard I-V curve to determine whether the cell string comprises the faulty string comprises:
calculating a difference between the actual I-V curve and the pre-obtained standard I-V curve; and
determining that the cell string comprises the faulty string when the difference is greater than a preset difference threshold.

17. A photovoltaic power generation system, comprising:
a cell string;
an inverter coupled to the cell string; and
a power station monitor coupled to the inverter through a communication connection, wherein the inverter or the power station monitor is configured to:
obtain at least two groups of current-voltage (I-V) values of the cell string;
perform fitting processing according to the at least two groups of the I-V values using a predetermined physical string model to obtain at least one characteristic parameter of the cell string, wherein the predetermined physical string model indicates a relationship between the I-V values of the cell string and the at least one characteristic parameter of the cell string, and wherein the at least one characteristic parameter comprises a constant in the predetermined physical string model indicating a relationship between a current and a voltage outputted by the cell string; and
separately compare the at least one characteristic parameter of the cell string with a standard characteristic parameter corresponding to each characteristic parameter to determine whether the cell string comprises a faulty string, wherein the standard characteristic parameter of the cell string comprises a pre-obtained standard value used for comparison with the characteristic parameter of the cell string.

18. The photovoltaic power generation system of claim 17, wherein when the predetermined physical string model comprises a half-mathematical and half-physical segment fitting model, the inverter or the power station monitor is further configured to:
divide a voltage value range of the cell string into at least two segments;
perform, in each segment, the fitting processing according to at least one group of the I-V values using a preset simplified physical model to obtain a characteristic parameter of the cell string in each segment; and set the characteristic parameter of the cell string in each segment as the at least one characteristic parameter of the cell string, wherein the voltage value range comprises a range between a short-circuit voltage of the cell string and any set value less than a maximum bearable voltage of the cell string.

19. The photovoltaic power generation system of claim 17, wherein the standard characteristic parameter of the cell string comprises a first standard characteristic parameter of the cell string during normal operation or a second standard characteristic parameter of the cell string in each fault case.

20. The photovoltaic power generation system of claim 19, wherein when the standard characteristic parameter comprises the first standard characteristic parameter, the inverter or the power station monitor is further configured to separately compare the at least one characteristic parameter of the cell string with the first standard characteristic parameter corresponding to each characteristic parameter, wherein the cell string does not comprise the faulty string when the at least one characteristic parameter falls in a preset range of the corresponding first standard characteristic parameter, and wherein the cell string comprises the faulty string when the at least one characteristic parameter does not fall in the preset range of the corresponding first standard characteristic parameter.

21. The photovoltaic power generation system of claim 19, wherein when the standard characteristic parameter comprises the second standard characteristic parameter of the cell string in each fault case, the inverter or the power station monitor is further configured to separately compare the at least one characteristic parameter of the cell string with the second standard characteristic parameter of the cell string in each fault case, wherein the cell string comprises the faulty string when the at least one characteristic parameter of the cell string falls in a preset range of the second standard characteristic parameter, and wherein a fault type of the cell string comprises a fault type corresponding to the second standard characteristic parameter.

22. The photovoltaic power generation system of claim 19, wherein the inverter or the power station monitor is configured to determine at least one faulty circuit from the faulty string.

23. The photovoltaic power generation system of claim 22, wherein the inverter or the power station monitor is further configured to:
determine a faulty circuit from the faulty string by infrared thermal near-end imaging or infrared thermal remote imaging;
determine the faulty circuit from the faulty string by electroluminescence (EL) near-end imaging or EL remote imaging; or determine the faulty circuit from the faulty string by optical near-end imaging or optical remote imaging.

24. The photovoltaic power generation system of claim 23, wherein the inverter or the power station monitor is further configured to:
control an inverter coupled to the faulty string to apply a voltage onto the faulty string to enable the faulty string to enter an EL state; and
determine the faulty circuit in the faulty string by near-end imaging or remote imaging.

25. The photovoltaic power generation system of claim 19, wherein the inverter or the power station monitor is further configured to apply a voltage onto the cell string using the inverter coupled to the cell string to obtain reversely inputted string I-V values.

26. The photovoltaic power generation system of claim 25, wherein a fault type of the cell string comprises at least one of the following types:
output power of a circuit in the cell string is abnormally degraded;
potential induced degradation (PID) occurs in the circuit in the cell string;
a cell inside the circuit in the cell string fails;
current mismatch exists in the circuit in the cell string;
a hot spot appears in the circuit in the cell string;
a diode inside the circuit in the cell string is short-circuited;
a glass panel of the circuit in the cell string is broken;
an open circuit exists inside the circuit in the cell string; or
the circuit in the cell string is blocked.

27. The photovoltaic power generation system of claim 19, wherein the inverter or the power station monitor is further configured to perform the fitting processing using the predetermined physical string model to obtain a first standard characteristic parameter of the cell string during normal operation or a second standard characteristic parameter of the cell string in each fault case.

28. A photovoltaic power generation system, comprising:
a cell string;
an inverter coupled to the cell string; and
a power station monitor coupled to the inverter through a communication connection, wherein the inverter or the power station monitor is configured to:
obtain at least two groups of current-voltage (I-V) values of the cell string;
perform fitting processing according to the at least two groups of I-V values using a predetermined physical string model to obtain an actual I-V curve of the cell string, wherein the predetermined physical string model indicates a relationship between a current and a voltage outputted by the cell string; and
compare the actual I-V curve of the cell string with a pre-obtained standard I-V curve to determine whether the cell string comprises a faulty string, wherein the pre-obtained standard I-V curve comprises a curve obtained by fitting according to I-V values outputted by the cell string in a normal operating state using the predetermined physical string model.

29. The photovoltaic power generation system of claim 28, wherein the inverter or the power station monitor is further configured to determine at least one faulty circuit from the faulty string.

30. The photovoltaic power generation system device of claim 28, wherein the inverter or the power station monitor is further executable instruction further causes the processor to be configured to perform the fitting processing according to the I-V values of the cell string using the predetermined physical string model and a standard characteristic parameter used during normal operation to obtain the pre-obtained standard I-V curve of the cell string.

* * * * *

UNITED STATES PATENT AND TRADEMARK OFFICE
CERTIFICATE OF CORRECTION

PATENT NO. : 10,985,696 B2  
APPLICATION NO. : 16/121197  
DATED : April 20, 2021  
INVENTOR(S) : Guangping Yang and Yongbing Gao It is certified that error appears in the above-identified patent and that said Letters Patent is hereby corrected as shown below:

In the Claims

Claim 1, Column 27, Line 54: "obtaining at least two" should read "at least two"

Claim 30, Column 32, Line 53: "generation system device of" should read "generation system of"

Claim 30, Column 32, Line 55-56: "is further executable instruction further causes the processor to be configured to perform" should read "is further configured to perform"

Signed and Sealed this  
Eighth Day of June, 2021

Drew Hirshfeld  
*Performing the Functions and Duties of the*  
*Under Secretary of Commerce for Intellectual Property and*  
*Director of the United States Patent and Trademark Office*